(12) United States Patent
Puskarich et al.

(10) Patent No.: US 10,013,058 B2
(45) Date of Patent: Jul. 3, 2018

(54) TOUCH-BASED USER INTERFACE WITH HAPTIC FEEDBACK

(75) Inventors: Paul G. Puskarich, Palo Alto, CA (US); Michael Pilliod, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 455 days.

(21) Appl. No.: 12/887,455

(22) Filed: Sep. 21, 2010

(65) Prior Publication Data

US 2012/0068957 A1    Mar. 22, 2012

(51) Int. Cl.
| | | |
|---|---|---|
| *G06F 3/045* | (2006.01) | |
| *G06F 3/01* | (2006.01) | |
| *G06F 3/0354* | (2013.01) | |
| *G06F 3/041* | (2006.01) | |
| *H01L 41/09* | (2006.01) | |
| *H01L 41/37* | (2013.01) | |

(52) U.S. Cl.
CPC ......... *G06F 3/016* (2013.01); *G06F 3/03547* (2013.01); *G06F 3/041* (2013.01); *H01L 41/0986* (2013.01); *H01L 41/37* (2013.01); *Y10T 29/42* (2015.01)

(58) Field of Classification Search
CPC ...... G06F 3/016; G06F 3/03547; G06F 3/041; G06F 3/011; H01L 41/0986; H01L 41/37; B06B 1/0629
USPC ....... 345/173–176, 168; 310/317; 340/407.2; 324/713
See application file for complete search history.

(56) References Cited

U.S. PATENT DOCUMENTS

| | | |
|---|---|---|
| 3,001,049 A | 9/1961 | Didier |
| 3,390,287 A | 6/1968 | Sonderegger |
| 3,419,739 A | 12/1968 | Clements |
| 4,236,132 A | 11/1980 | Zissimopoulos |
| 4,412,148 A | 10/1983 | Klicker et al. |
| 4,414,984 A | 11/1983 | Zarudiansky |
| 4,695,813 A | 9/1987 | Nobutoki et al. |
| 4,975,616 A | 12/1990 | Park |
| 5,010,772 A | 4/1991 | Bourland |
| 5,245,734 A | 9/1993 | Issartel |

(Continued)

FOREIGN PATENT DOCUMENTS

| | | |
|---|---|---|
| AU | 2015100710 | 7/2015 |
| AU | 2016100399 | 5/2016 |

(Continued)

OTHER PUBLICATIONS

International Search Report and Written Opinion, PCT/US2011/048808, 23 pages, dated Apr. 2, 2012.

(Continued)

*Primary Examiner* — Kumar Patel
*Assistant Examiner* — Kuo Woo
(74) *Attorney, Agent, or Firm* — Brownstein Hyatt Farber Screck, LLP

(57) ABSTRACT

One embodiment of a touch-based user interface may include a haptic feedback layer with one or more actuators configured to supply a haptic feedback. The one or more actuators may be embedded in a nonconductive material. The touch-based user interface may further include a printed circuit board layer underlying the haptic feedback layer. The printed circuit board layer may include one or more conductive traces configured to supply a voltage to the one or more actuators.

20 Claims, 19 Drawing Sheets

(56) References Cited

U.S. PATENT DOCUMENTS

| | | | |
|---|---|---|---|
| 5,283,408 | A | 2/1994 | Chen |
| 5,293,161 | A | 3/1994 | MacDonald et al. |
| 5,317,221 | A | 5/1994 | Kubo et al. |
| 5,365,140 | A | 11/1994 | Ohya et al. |
| 5,434,549 | A | 7/1995 | Hirabayashi et al. |
| 5,436,622 | A | 7/1995 | Gutman et al. |
| 5,510,584 | A | 4/1996 | Norris |
| 5,510,783 | A | 4/1996 | Findlater et al. |
| 5,513,100 | A | 4/1996 | Parker et al. |
| 5,587,875 | A | 12/1996 | Sellers |
| 5,590,020 | A | 12/1996 | Sellers |
| 5,602,715 | A | 2/1997 | Lempicki et al. |
| 5,619,005 | A | 4/1997 | Shibukawa et al. |
| 5,621,610 | A | 4/1997 | Moore et al. |
| 5,625,532 | A | 4/1997 | Sellers |
| 5,629,578 | A | 5/1997 | Winzer et al. |
| 5,635,928 | A | 6/1997 | Takagi et al. |
| 5,718,418 | A | 2/1998 | Gugsch |
| 5,739,759 | A | 4/1998 | Nakazawa et al. |
| 5,742,242 | A | 4/1998 | Sellers |
| 5,783,765 | A | 7/1998 | Muramatsu |
| 5,793,605 | A | 8/1998 | Sellers |
| 5,812,116 | A | 9/1998 | Malhi |
| 5,813,142 | A | 9/1998 | Demon |
| 5,818,149 | A | 10/1998 | Safari et al. |
| 5,896,076 | A | 4/1999 | Van Namen |
| 5,907,199 | A | 5/1999 | Miller |
| 5,951,908 | A | 9/1999 | Cui et al. |
| 5,959,613 | A | 9/1999 | Rosenberg et al. |
| 5,973,441 | A | 10/1999 | Lo et al. |
| 5,982,304 | A | 11/1999 | Selker et al. |
| 5,982,612 | A | 11/1999 | Roylance |
| 5,995,026 | A | 11/1999 | Sellers |
| 5,999,084 | A | 12/1999 | Armstrong |
| 6,069,433 | A | 5/2000 | Lazarus et al. |
| 6,078,308 | A | 6/2000 | Rosenberg et al. |
| 6,127,756 | A | 10/2000 | Iwaki |
| 6,135,886 | A | 10/2000 | Armstrong |
| 6,218,966 | B1 | 4/2001 | Goodwin |
| 6,220,550 | B1 | 4/2001 | McKillip, Jr. |
| 6,222,525 | B1 | 4/2001 | Armstrong |
| 6,252,336 | B1 | 6/2001 | Hall |
| 6,342,880 | B2 | 1/2002 | Rosenberg et al. |
| 6,351,205 | B1 | 2/2002 | Armstrong |
| 6,373,465 | B2 | 4/2002 | Jolly et al. |
| 6,408,187 | B1 | 6/2002 | Merriam |
| 6,411,276 | B1 | 6/2002 | Braun et al. |
| 6,429,849 | B1 | 8/2002 | An |
| 6,438,393 | B1 | 8/2002 | Surronen |
| 6,444,928 | B2 | 9/2002 | Okamoto et al. |
| 6,455,973 | B1 | 9/2002 | Ineson |
| 6,465,921 | B1 | 10/2002 | Horng |
| 6,552,404 | B1 | 4/2003 | Hynes |
| 6,552,471 | B1 | 4/2003 | Chandran et al. |
| 6,557,072 | B2 | 4/2003 | Osborn |
| 6,642,857 | B1 | 11/2003 | Schediwy |
| 6,693,626 | B1 | 2/2004 | Rosenberg |
| 6,717,573 | B1 | 4/2004 | Shahoian et al. |
| 6,809,462 | B2 | 10/2004 | Pelrine et al. |
| 6,809,727 | B2 | 10/2004 | Piot et al. |
| 6,864,877 | B2 | 3/2005 | Braun et al. |
| 6,906,697 | B2 | 6/2005 | Rosenberg |
| 6,906,700 | B1 | 6/2005 | Armstrong |
| 6,906,703 | B2 | 6/2005 | Vablais et al. |
| 6,952,203 | B2 | 10/2005 | Banerjee et al. |
| 6,954,657 | B2 | 10/2005 | Bork et al. |
| 6,963,762 | B2 | 11/2005 | Kaaresoja et al. |
| 6,995,752 | B2 | 2/2006 | Lu |
| 7,005,811 | B2 | 2/2006 | Wakuda et al. |
| 7,016,707 | B2 | 3/2006 | Fujisawa et al. |
| 7,022,927 | B2 | 4/2006 | Hsu |
| 7,023,112 | B2 | 4/2006 | Miyamoto et al. |
| 7,081,701 | B2 | 7/2006 | Yoon et al. |
| 7,121,147 | B2 | 10/2006 | Okada |
| 7,123,948 | B2 | 10/2006 | Nielsen |
| 7,130,664 | B1 | 10/2006 | Williams |
| 7,136,045 | B2 | 11/2006 | Rosenberg et al. |
| 7,161,580 | B2 | 1/2007 | Bailey et al. |
| 7,162,928 | B2 | 1/2007 | Shank et al. |
| 7,170,498 | B2 | 1/2007 | Huang |
| 7,176,906 | B2 | 2/2007 | Williams et al. |
| 7,182,691 | B1 | 2/2007 | Schena |
| 7,194,645 | B2 | 3/2007 | Bieswanger et al. |
| 7,217,891 | B2 | 5/2007 | Fischer et al. |
| 7,218,310 | B2 | 5/2007 | Tierling et al. |
| 7,219,561 | B2 | 5/2007 | Okada |
| 7,253,350 | B2 | 8/2007 | Noro et al. |
| 7,333,604 | B2 | 2/2008 | Zernovizky et al. |
| 7,334,350 | B2 | 2/2008 | Ellis |
| 7,348,968 | B2 | 3/2008 | Dawson |
| 7,388,741 | B2 | 6/2008 | Konuma et al. |
| 7,392,066 | B2 | 6/2008 | Hapamas |
| 7,423,631 | B2 | 9/2008 | Shahoian et al. |
| 7,446,752 | B2 | 11/2008 | Goldenberg et al. |
| 7,469,595 | B2 | 12/2008 | Kessler et al. |
| 7,495,358 | B2 | 2/2009 | Kobayashi et al. |
| 7,508,382 | B2 | 3/2009 | Denoue et al. |
| 7,561,142 | B2 | 7/2009 | Shahoian et al. |
| 7,562,468 | B2 | 7/2009 | Ellis |
| 7,569,086 | B2 | 8/2009 | Kikuchi et al. |
| 7,575,368 | B2 | 8/2009 | Guillaume |
| 7,586,220 | B2 | 9/2009 | Roberts |
| 7,619,498 | B2 | 11/2009 | Miura |
| 7,639,232 | B2 | 12/2009 | Grant et al. |
| 7,641,618 | B2 | 1/2010 | Noda et al. |
| 7,675,253 | B2 | 3/2010 | Dorel |
| 7,675,414 | B2 | 3/2010 | Ray |
| 7,679,611 | B2 | 3/2010 | Schena |
| 7,707,742 | B2 | 5/2010 | Ellis |
| 7,710,399 | B2 | 5/2010 | Bruneau et al. |
| 7,732,951 | B2 | 6/2010 | Mukaide |
| 7,742,036 | B2 | 6/2010 | Grant et al. |
| 7,788,032 | B2 | 8/2010 | Moloney |
| 7,793,429 | B2 | 9/2010 | Ellis |
| 7,793,430 | B2 | 9/2010 | Ellis |
| 7,798,982 | B2 | 9/2010 | Zets et al. |
| 7,868,489 | B2 | 1/2011 | Amemiya et al. |
| 7,888,892 | B2 | 2/2011 | McReynolds et al. |
| 7,893,922 | B2 | 2/2011 | Klinghult et al. |
| 7,919,945 | B2 | 4/2011 | Houston et al. |
| 7,929,382 | B2 | 4/2011 | Yamazaki |
| 7,946,483 | B2 | 5/2011 | Miller et al. |
| 7,952,261 | B2 | 5/2011 | Lipton et al. |
| 7,952,566 | B2 | 5/2011 | Poupyrev et al. |
| 7,956,770 | B2 | 6/2011 | Klinghult et al. |
| 7,961,909 | B2 | 6/2011 | Mandella et al. |
| 8,031,172 | B2 | 10/2011 | Kruse et al. |
| 8,044,940 | B2 | 10/2011 | Narusawa |
| 8,069,881 | B1 | 12/2011 | Cunha |
| 8,077,145 | B2 | 12/2011 | Rosenberg et al. |
| 8,081,156 | B2 | 12/2011 | Ruettiger |
| 8,082,640 | B2 | 12/2011 | Takeda |
| 8,098,234 | B2 | 1/2012 | Lacroix et al. |
| 8,123,660 | B2 | 2/2012 | Kruse et al. |
| 8,125,453 | B2 | 2/2012 | Shahoian et al. |
| 8,141,276 | B2 | 3/2012 | Ellis |
| 8,156,809 | B2 | 4/2012 | Tierling et al. |
| 8,174,372 | B2 * | 5/2012 | da Costa .................. 340/407.2 |
| 8,179,202 | B2 | 5/2012 | Cruz-Hernandez et al. |
| 8,188,623 | B2 | 5/2012 | Park |
| 8,205,356 | B2 | 6/2012 | Ellis |
| 8,210,942 | B2 | 7/2012 | Shimabukuro et al. |
| 8,232,494 | B2 | 7/2012 | Purcocks |
| 8,248,277 | B2 | 8/2012 | Peterson et al. |
| 8,248,278 | B2 | 8/2012 | Schlosser et al. |
| 8,253,686 | B2 | 8/2012 | Kyung et al. |
| 8,255,004 | B2 | 8/2012 | Huang et al. |
| 8,261,468 | B2 | 9/2012 | Ellis |
| 8,270,114 | B2 | 9/2012 | Argumedo et al. |
| 8,288,899 | B2 | 10/2012 | Park et al. |
| 8,291,614 | B2 | 10/2012 | Ellis |
| 8,294,600 | B2 | 10/2012 | Peterson et al. |
| 8,315,746 | B2 | 11/2012 | Cox et al. |
| 8,378,798 | B2 | 2/2013 | Bells et al. |

(56) References Cited

U.S. PATENT DOCUMENTS

| | | |
|---|---|---|
| 8,384,679 B2 | 2/2013 | Paleczny et al. |
| 8,395,587 B2 | 3/2013 | Cauwels et al. |
| 8,398,570 B2 | 3/2013 | Mortimer et al. |
| 8,411,058 B2 | 4/2013 | Wong et al. |
| 8,446,264 B2 | 5/2013 | Tanase |
| 8,451,255 B2 | 5/2013 | Weber et al. |
| 8,461,951 B2 | 6/2013 | Gassmann et al. |
| 8,466,889 B2 | 6/2013 | Tong et al. |
| 8,471,690 B2 | 6/2013 | Hennig et al. |
| 8,515,398 B2 | 8/2013 | Song et al. |
| 8,542,134 B2 | 9/2013 | Peterson et al. |
| 8,545,322 B2 | 10/2013 | George et al. |
| 8,547,341 B2 | 10/2013 | Takashima et al. |
| 8,570,291 B2 | 10/2013 | Motomura |
| 8,575,794 B2 | 11/2013 | Lee et al. |
| 8,596,755 B2 | 12/2013 | Hibi |
| 8,598,893 B2 | 12/2013 | Camus |
| 8,599,047 B2 | 12/2013 | Schlosser et al. |
| 8,599,152 B1 | 12/2013 | Wurtenberger et al. |
| 8,600,354 B2 | 12/2013 | Esaki |
| 8,621,348 B2 | 12/2013 | Ramsay et al. |
| 8,629,843 B2 | 1/2014 | Steeves et al. |
| 8,674,941 B2 | 3/2014 | Casparian et al. |
| 8,680,723 B2 | 3/2014 | Subramanian |
| 8,681,092 B2 | 3/2014 | Harada et al. |
| 8,682,396 B2 | 3/2014 | Yang et al. |
| 8,686,952 B2 | 4/2014 | Pope et al. |
| 8,710,966 B2 | 4/2014 | Hill |
| 8,723,813 B2 | 5/2014 | Park et al. |
| 8,735,755 B2 | 5/2014 | Peterson et al. |
| 8,760,273 B2 | 6/2014 | Casparian et al. |
| 8,780,060 B2 | 7/2014 | Maschmeyer et al. |
| 8,787,006 B2 | 7/2014 | Golko et al. |
| 8,797,152 B2 | 8/2014 | Henderson et al. |
| 8,798,534 B2 | 8/2014 | Rodriguez et al. |
| 8,845,071 B2 | 9/2014 | Yamamoto et al. |
| 8,857,248 B2 | 10/2014 | Shih et al. |
| 8,861,776 B2 | 10/2014 | Lastrucci |
| 8,866,600 B2 | 10/2014 | Yang et al. |
| 8,890,668 B2 | 11/2014 | Pance et al. |
| 8,928,621 B2 | 1/2015 | Ciesla et al. |
| 8,948,821 B2 | 2/2015 | Newham et al. |
| 8,970,534 B2 | 3/2015 | Adachi et al. |
| 8,976,141 B2 | 3/2015 | Myers et al. |
| 9,008,730 B2 | 4/2015 | Kim et al. |
| 9,019,088 B2 | 4/2015 | Zawacki et al. |
| 9,035,887 B1 | 5/2015 | Prud'Hommeaux et al. |
| 9,072,576 B2 | 7/2015 | Nishiura |
| 9,083,821 B2 | 7/2015 | Hughes |
| 9,092,129 B2 | 7/2015 | Abdo et al. |
| 9,098,991 B2 | 8/2015 | Park et al. |
| 9,122,325 B2 | 9/2015 | Peshkin et al. |
| 9,131,039 B2 | 9/2015 | Behles |
| 9,134,834 B2 | 9/2015 | Reshef |
| 9,158,379 B2 | 10/2015 | Cruz-Hernandez et al. |
| 9,189,932 B2 | 11/2015 | Kerdemelidis et al. |
| 9,201,458 B2 | 12/2015 | Hunt et al. |
| 9,235,267 B2 | 1/2016 | Pope et al. |
| 9,274,601 B2 | 3/2016 | Faubert et al. |
| 9,274,602 B2 | 3/2016 | Garg et al. |
| 9,274,603 B2 | 3/2016 | Modarres et al. |
| 9,275,815 B2 | 3/2016 | Hoffmann |
| 9,300,181 B2 | 3/2016 | Maeda et al. |
| 9,317,116 B2 | 4/2016 | Ullrich et al. |
| 9,318,942 B2 | 4/2016 | Sugita et al. |
| 9,325,230 B2 | 4/2016 | Yamada et al. |
| 9,357,052 B2 | 5/2016 | Ullrich |
| 9,360,944 B2 | 6/2016 | Pinault |
| 9,390,599 B2 | 7/2016 | Weinberg |
| 9,396,434 B2 | 7/2016 | Rothkopf |
| 9,405,369 B2 | 8/2016 | Modarres et al. |
| 9,449,476 B2 | 9/2016 | Lynn |
| 9,454,239 B2 | 9/2016 | Elias et al. |
| 9,467,033 B2 | 10/2016 | Jun et al. |
| 9,477,342 B2 | 10/2016 | Daverman et al. |
| 9,480,947 B2 | 11/2016 | Jiang et al. |
| 9,501,912 B1 | 11/2016 | Havskjold et al. |
| 9,594,450 B2 | 7/2017 | Lynn et al. |
| 9,779,592 B1 | 10/2017 | Hoen |
| 9,934,661 B2 | 4/2018 | Hill |
| 2003/0210259 A1 | 11/2003 | Liu |
| 2004/0021663 A1 | 2/2004 | Suzuki et al. |
| 2004/0127198 A1 | 7/2004 | Roskind et al. |
| 2005/0057528 A1 | 3/2005 | Kleen |
| 2005/0107129 A1 | 5/2005 | Kaewell et al. |
| 2005/0110778 A1 | 5/2005 | Ben Ayed |
| 2005/0118922 A1 | 6/2005 | Endo |
| 2005/0217142 A1 | 10/2005 | Ellis |
| 2005/0237306 A1 | 10/2005 | Klein et al. |
| 2005/0248549 A1 | 11/2005 | Dietz et al. |
| 2005/0258715 A1 | 11/2005 | Schlabach |
| 2006/0014569 A1 | 1/2006 | DelGiorno |
| 2006/0119586 A1* | 6/2006 | Grant ............... G06F 3/016 345/173 |
| 2006/0154674 A1 | 7/2006 | Landschaft et al. |
| 2006/0209037 A1 | 9/2006 | Wang et al. |
| 2006/0239746 A1 | 10/2006 | Grant |
| 2006/0252463 A1 | 11/2006 | Liao |
| 2007/0099574 A1 | 5/2007 | Wang |
| 2007/0152974 A1 | 7/2007 | Kim et al. |
| 2007/0178942 A1 | 8/2007 | Sadler et al. |
| 2007/0188450 A1 | 8/2007 | Hernandez et al. |
| 2008/0084384 A1 | 4/2008 | Gregorio et al. |
| 2008/0158149 A1 | 7/2008 | Levin |
| 2008/0165148 A1 | 7/2008 | Williamson |
| 2008/0181501 A1 | 7/2008 | Faraboschi |
| 2008/0181706 A1 | 7/2008 | Jackson |
| 2008/0192014 A1 | 8/2008 | Kent et al. |
| 2008/0204428 A1* | 8/2008 | Pierce ............... G06F 3/0202 345/174 |
| 2008/0252594 A1 | 10/2008 | Gregorio et al. |
| 2008/0255794 A1 | 10/2008 | Levine |
| 2008/0291620 A1 | 11/2008 | DiFonzo et al. |
| 2009/0002328 A1 | 1/2009 | Ullrich et al. |
| 2009/0115734 A1 | 5/2009 | Fredriksson et al. |
| 2009/0120105 A1 | 5/2009 | Ramsay et al. |
| 2009/0128503 A1 | 5/2009 | Grant et al. |
| 2009/0135142 A1 | 5/2009 | Fu et al. |
| 2009/0160813 A1* | 6/2009 | Takashima et al. ........ 345/173 |
| 2009/0167542 A1 | 7/2009 | Culbert et al. |
| 2009/0167702 A1 | 7/2009 | Nurmi |
| 2009/0167704 A1 | 7/2009 | Terlizzi et al. |
| 2009/0218148 A1 | 9/2009 | Hugeback et al. |
| 2009/0225046 A1* | 9/2009 | Kim ............... G06F 3/016 345/173 |
| 2009/0236210 A1 | 9/2009 | Clark et al. |
| 2009/0267892 A1 | 10/2009 | Faubert |
| 2009/0267920 A1 | 10/2009 | Faubert et al. |
| 2009/0305744 A1 | 12/2009 | Ullrich |
| 2009/0313542 A1 | 12/2009 | Cruz-Hernandez et al. |
| 2009/0322496 A1* | 12/2009 | da Costa ............... G06F 3/016 340/407.2 |
| 2010/0020036 A1 | 1/2010 | Hui et al. |
| 2010/0048256 A1 | 2/2010 | Huppi et al. |
| 2010/0053087 A1* | 3/2010 | Dai ............... G06F 3/016 345/168 |
| 2010/0079264 A1 | 4/2010 | Hoellwarth |
| 2010/0089735 A1 | 4/2010 | Takeda et al. |
| 2010/0141606 A1 | 6/2010 | Bae et al. |
| 2010/0152620 A1 | 6/2010 | Ramsay et al. |
| 2010/0164894 A1 | 7/2010 | Kim et al. |
| 2010/0188422 A1 | 7/2010 | Shingai et al. |
| 2010/0194547 A1 | 8/2010 | Terrell et al. |
| 2010/0225340 A1* | 9/2010 | Smith ............... G06F 3/011 324/713 |
| 2010/0231508 A1 | 9/2010 | Cruz-Hernandez et al. |
| 2010/0231550 A1 | 9/2010 | Cruz-Hernandez et al. |
| 2010/0265197 A1 | 10/2010 | Purdy |
| 2010/0309141 A1 | 12/2010 | Cruz-Hernandez et al. |
| 2010/0328229 A1 | 12/2010 | Weber et al. |
| 2011/0012717 A1 | 1/2011 | Pance et al. |
| 2011/0043454 A1* | 2/2011 | Modarres ............ B06B 1/0629 345/173 |
| 2011/0053577 A1 | 3/2011 | Lee et al. |

(56) References Cited

U.S. PATENT DOCUMENTS

| | | |
|---|---|---|
| 2011/0075835 A1 | 3/2011 | Hill |
| 2011/0077055 A1 | 3/2011 | Hill |
| 2011/0107958 A1 | 5/2011 | Pance et al. |
| 2011/0121765 A1 | 5/2011 | Anderson et al. |
| 2011/0128239 A1 | 6/2011 | Polyakov et al. |
| 2011/0141052 A1* | 6/2011 | Bernstein et al. ............ 345/174 |
| 2011/0148608 A1 | 6/2011 | Grant et al. |
| 2011/0163985 A1 | 7/2011 | Bae et al. |
| 2011/0175692 A1 | 7/2011 | Niiyama |
| 2011/0193824 A1 | 8/2011 | Modarres et al. |
| 2011/0203912 A1 | 8/2011 | Niu |
| 2011/0248948 A1 | 10/2011 | Griffin et al. |
| 2011/0260988 A1 | 10/2011 | Colgate et al. |
| 2011/0263200 A1 | 10/2011 | Thornton et al. |
| 2011/0291950 A1 | 12/2011 | Tong |
| 2011/0304559 A1 | 12/2011 | Pasquero |
| 2012/0075198 A1 | 3/2012 | Sulem et al. |
| 2012/0092263 A1 | 4/2012 | Peterson et al. |
| 2012/0126959 A1 | 5/2012 | Zarrabi et al. |
| 2012/0127088 A1 | 5/2012 | Pance et al. |
| 2012/0133494 A1 | 5/2012 | Cruz-Hernandez et al. |
| 2012/0139844 A1 | 6/2012 | Ramstein et al. |
| 2012/0206248 A1 | 8/2012 | Biggs |
| 2012/0223824 A1 | 9/2012 | Rothkopf |
| 2012/0256848 A1 | 10/2012 | Madabusi Srinivasan |
| 2012/0268412 A1 | 10/2012 | Cruz-Hernandez et al. |
| 2012/0274578 A1 | 11/2012 | Snow et al. |
| 2012/0280927 A1 | 11/2012 | Ludwig |
| 2012/0286943 A1 | 11/2012 | Rothkopf et al. |
| 2012/0319827 A1 | 12/2012 | Pance et al. |
| 2012/0327006 A1 | 12/2012 | Israr et al. |
| 2013/0027345 A1 | 1/2013 | Binzel |
| 2013/0063356 A1 | 3/2013 | Martisauskas |
| 2013/0106699 A1 | 5/2013 | Babatunde |
| 2013/0120290 A1 | 5/2013 | Yumiki et al. |
| 2013/0124076 A1 | 5/2013 | Bruni et al. |
| 2013/0181913 A1 | 7/2013 | Cole et al. |
| 2013/0191741 A1 | 7/2013 | Dickinson et al. |
| 2013/0207793 A1 | 8/2013 | Weaber et al. |
| 2013/0217491 A1 | 8/2013 | Hilbert et al. |
| 2013/0222280 A1 | 8/2013 | Sheynblat et al. |
| 2013/0228023 A1 | 9/2013 | Drasnin et al. |
| 2013/0261811 A1 | 10/2013 | Yagi et al. |
| 2013/0300549 A1 | 11/2013 | Hill |
| 2013/0300590 A1 | 11/2013 | Dietz et al. |
| 2014/0035397 A1 | 2/2014 | Endo et al. |
| 2014/0082490 A1 | 3/2014 | Jung et al. |
| 2014/0091857 A1 | 4/2014 | Bernstein |
| 2014/0143785 A1 | 5/2014 | Mistry et al. |
| 2014/0197936 A1 | 7/2014 | Biggs et al. |
| 2014/0232534 A1 | 8/2014 | Birnbaum et al. |
| 2014/0267076 A1 | 9/2014 | Birnbaum et al. |
| 2014/0267952 A1 | 9/2014 | Sirois |
| 2015/0005039 A1 | 1/2015 | Liu et al. |
| 2015/0040005 A1 | 2/2015 | Faaborg |
| 2015/0061848 A1 | 3/2015 | Hill |
| 2015/0090572 A1 | 4/2015 | Lee et al. |
| 2015/0109215 A1 | 4/2015 | Puskarich |
| 2015/0169059 A1 | 6/2015 | Behles et al. |
| 2015/0192414 A1 | 7/2015 | Das et al. |
| 2015/0194165 A1 | 7/2015 | Faaborg et al. |
| 2015/0220199 A1 | 8/2015 | Wang et al. |
| 2015/0227204 A1 | 8/2015 | Gipson et al. |
| 2015/0296480 A1 | 10/2015 | Kinsey et al. |
| 2015/0324049 A1 | 11/2015 | Kies et al. |
| 2015/0349619 A1 | 12/2015 | Degner et al. |
| 2016/0049265 A1 | 2/2016 | Bernstein |
| 2016/0063826 A1 | 3/2016 | Morrell et al. |
| 2016/0071384 A1 | 3/2016 | Hill |
| 2016/0162025 A1 | 6/2016 | Shah |
| 2016/0163165 A1 | 6/2016 | Morrell et al. |
| 2016/0172953 A1 | 6/2016 | Degner et al. |
| 2016/0195929 A1 | 7/2016 | Martinez et al. |
| 2016/0196935 A1 | 7/2016 | Bernstein |
| 2016/0206921 A1 | 7/2016 | Szabados et al. |
| 2016/0211736 A1 | 7/2016 | Moussette et al. |
| 2016/0216764 A1 | 7/2016 | Morrell et al. |
| 2016/0216766 A1 | 7/2016 | Puskarich |
| 2016/0231815 A1 | 8/2016 | Moussette et al. |
| 2016/0233012 A1 | 8/2016 | Lubinski et al. |
| 2016/0241119 A1 | 8/2016 | Keeler |
| 2016/0259480 A1 | 9/2016 | Augenbergs et al. |
| 2016/0306423 A1 | 10/2016 | Uttermann et al. |
| 2016/0371942 A1 | 12/2016 | Smith, IV et al. |
| 2017/0038905 A1 | 2/2017 | Bijamov et al. |
| 2017/0070131 A1 | 3/2017 | Degner et al. |
| 2017/0257844 A1 | 9/2017 | Miller et al. |
| 2017/0285747 A1 | 10/2017 | Chen |
| 2017/0311282 A1 | 10/2017 | Miller et al. |
| 2017/0357325 A1 | 12/2017 | Yang et al. |
| 2017/0364158 A1 | 12/2017 | Wen et al. |
| 2018/0075715 A1 | 3/2018 | Morrell et al. |
| 2018/0081441 A1 | 3/2018 | Pedder et al. |

FOREIGN PATENT DOCUMENTS

| | | |
|---|---|---|
| CA | 2355434 | 2/2002 |
| CN | 1817321 | 8/2006 |
| CN | 101409164 | 4/2009 |
| CN | 101763192 | 6/2010 |
| CN | 101903848 | 12/2010 |
| CN | 102025257 | 4/2011 |
| CN | 102246122 | 11/2011 |
| CN | 102315747 | 1/2012 |
| CN | 102591512 | 7/2012 |
| CN | 102713805 | 10/2012 |
| CN | 102844972 | 12/2012 |
| CN | 103181090 | 6/2013 |
| CN | 103416043 | 11/2013 |
| DE | 19517630 | 11/1996 |
| DE | 10330024 | 1/2005 |
| DE | 102009038103 | 2/2011 |
| DE | 10201115762 | 4/2013 |
| EP | 0483955 | 5/1992 |
| EP | 1047258 | 10/2000 |
| EP | 1686776 | 8/2006 |
| EP | 2060967 | 5/2009 |
| EP | 2073099 | 6/2009 |
| EP | 2194444 | 6/2010 |
| EP | 2264562 A3 | 12/2010 |
| EP | 2315186 | 4/2011 |
| EP | 2374430 | 10/2011 |
| EP | 2395414 | 12/2011 |
| EP | 2461228 | 6/2012 |
| EP | 2631746 | 8/2013 |
| EP | 2434555 | 10/2013 |
| JP | H05301342 A2 | 11/1993 |
| JP | 2002199689 | 7/2002 |
| JP | 2002102799 | 9/2002 |
| JP | 200362525 | 3/2003 |
| JP | 2004236202 | 8/2004 |
| KR | 20050033909 | 4/2005 |
| KR | 1020100046602 | 5/2010 |
| KR | 1020110101516 | 9/2011 |
| KR | 20130024420 | 3/2013 |
| TW | 200518000 | 11/2007 |
| TW | 200951944 | 12/2009 |
| TW | 201145336 | 12/2011 |
| TW | 201218039 | 5/2012 |
| TW | 201425180 | 7/2014 |
| WO | WO1997/16932 | 5/1997 |
| WO | WO 01/059588 | 8/2001 |
| WO | WO2002/073587 | 9/2002 |
| WO | WO 03/038800 | 5/2003 |
| WO | WO2006/057770 | 6/2006 |
| WO | WO2007/114631 | 10/2007 |
| WO | WO2008/075082 | 6/2008 |
| WO | WO2009/038862 | 3/2009 |
| WO | WO2009/068986 | 6/2009 |
| WO | WO2009/097866 | 8/2009 |
| WO | WO2009/122331 | 10/2009 |
| WO | WO2009/150287 | 12/2009 |
| WO | WO 10/085575 | 7/2010 |
| WO | WO2010/087925 | 8/2010 |

(56) References Cited

FOREIGN PATENT DOCUMENTS

| WO | WO 11/007263 | 1/2011 |
|---|---|---|
| WO | WO 12/052635 | 4/2012 |
| WO | WO 12/129247 | 9/2012 |
| WO | WO 13/069148 | 5/2013 |
| WO | WO 13/169302 | 11/2013 |
| WO | WO 14/018086 | 1/2014 |
| WO | WO 13/169299 | 11/2014 |
| WO | WO 15/023670 | 2/2015 |

OTHER PUBLICATIONS

Hasser et al., "Preliminary Evaluation of a Shape-Memory Alloy Tactile Feedback Display," Advances in Robotics, Mechantronics, and Haptic Interfaces, ASME, DSC—vol. 49, pp. 73-80, 1993.

Hill et al., "Real-time Estimation of Human Impedance for Haptic Interfaces," Stanford Telerobotics Laboratory, Department of Mechanical Engineering, Standford University, 6 pages, at least as early as Sep. 30, 2009.

Lee et al, "Haptic Pen: Tactile Feedback Stylus for Touch Screens," Mitsubishi Electric Research Laboratories, http://wwwlmerl.com, 6 pages, Oct. 2004.

Office Action dated May 15, 2014, TW 100132478, 8 pages.

Kim et al., "Tactile Rendering of 3D Features on Touch Surfaces," UIST '13, Oct. 8-11, 2013, St. Andrews, United Kingdom, 8 pages.

European Search Report dated Jul. 7, 2015, EP 11752699.6, 7 pages.

U.S. Appl. No. 14/910,108, filed Feb. 4, 2016, Martinez et al.
U.S. Appl. No. 15/045,761, filed Feb. 17, 2016, Morrell et al.
U.S. Appl. No. 15/046,194, filed Feb. 17, 2016, Degner et al.
U.S. Appl. No. 15/047,447, filed Feb. 18, 2016, Augenbergs et al.
U.S. Appl. No. 15/102,826, filed Jun. 8, 2016 Smith et al.
U.S. Appl. No. 15/251,459, filed Aug. 30, 2016, Miller et al.
U.S. Appl. No. 15/260,047, filed Sep. 8, 2016, Degner.
U.S. Appl. No. 15/306,034, filed Oct. 21, 2016, Bijamov et al.
Astronomer's Toolbox, "The Electromagnetic Spectrum," http://imagine.gsfc.nasa.gov/science/toolbox/emspectrum1.html, updated Mar. 2013, 4 pages.
U.S. Appl. No. 15/364,822, filed Nov. 30, 2016, Chen.
U.S. Appl. No. 15/583,938, filed May 1, 2017, Hill.
Nakamura, "A Torso Haptic Display Based on Shape Memory Alloy Actuators," Massachusetts Institute of Technology, 2003, pp. 1-123.
U.S. Appl. No. 15/621,966, filed Jun. 13, 2017, Pedder et al.
U.S. Appl. No. 15/621,930, filed Jun. 13, 2017, Wen et al.
U.S. Appl. No. 15/622,017, filed Jun. 13, 2017, Yang et al.
U.S. Appl. No. 15/641,192, filed Jul. 3, 2017, Miller et al.
U.S. Appl. No. 15/800,630, filed Nov. 1, 2017, Morrell et al.
U.S. Appl. No. 13/630,867, filed Sep. 28, 2012, Bernstein.
U.S. Appl. No. 14/059,693, filed Oct. 22, 2013, Puskarich.
U.S. Appl. No. 14/165,475, filed Jan. 27, 2014, Hayskjold et al.
U.S. Appl. No. 14/493,190, filed Sep. 22, 2014, Hoen.
U.S. Appl. No. 14/512,927, filed Oct. 13, 2014, Hill.
U.S. Appl. No. 14/928,465, filed Oct. 30, 2015, Bernstein.

* cited by examiner

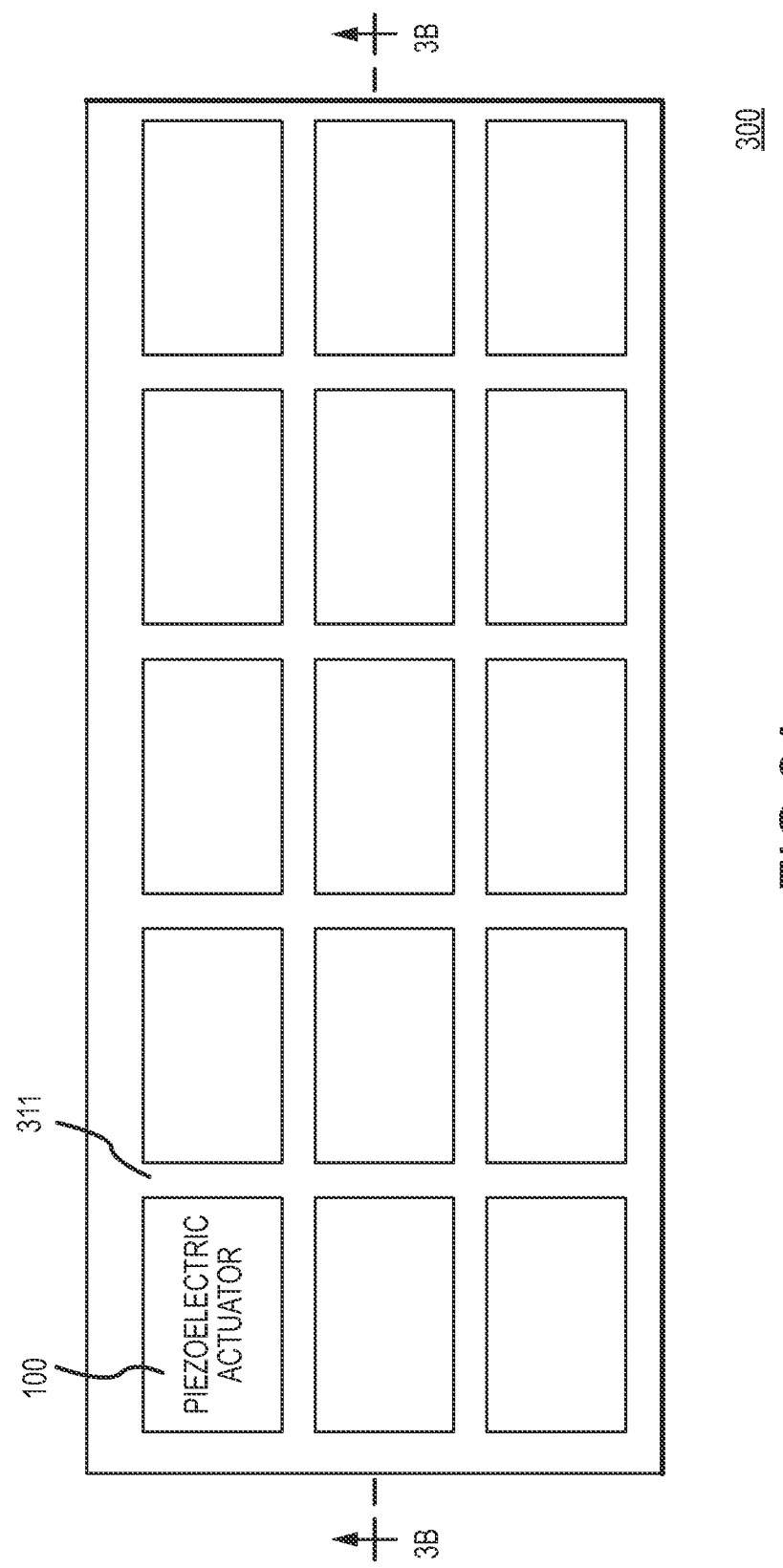

TOUCH-BASED USER INTERFACE WITH HAPTIC FEEDBACK

BACKGROUND

I. Technical Field

Embodiments described herein relate generally to touch-based user interfaces, such as a track pad or a touch screen, and more particularly, to touch-based user interfaces capable of providing localized haptic feedback to a user.

II. Background Discussion

Existing touch-based user interfaces typically have a touch panel and a visual display component. The touch panel may include a touch sensitive surface that, in response to detecting a touch event, generates a signal that can be processed and utilized by other components of an electronic device. The touch sensitive surface may be separate from the display component, such as in the case of a trackpad, or may be integrated into or positioned in front of the viewable area of the display screen, such as in the case of a display touchscreen.

In either case, the display component may display textual and/or graphical display elements representing selectable virtual buttons or icons, and the touch sensitive surface may allow a user to navigate the content displayed on the display screen. Typically, a user may move one or more objects, such as a finger or a stylus, across the touch sensitive surface in a pattern that the device translates into an input command. As an example, some electronic devices allow the user to select a virtual button by tapping a portion of the touch sensitive surface corresponding to the virtual button. Other electronic devices include a touch sensitive surface that can detect more than one simultaneous touch events in different locations on the touchscreen.

Existing touch-based user interfaces do not provide haptic feedback to a user. Haptic feedback may be any type of tactile feedback that takes advantage of a user's sense of touch, for example, by applying forces, vibrations, and/or motions to the user. The user can typically only feel the rigid surface of the touch screen, making it difficult to find icons, hyperlinks, textboxes, or other user-selectable input elements that are being displayed. A touch-based user interface may help a user navigate content displayed on the display screen by incorporating haptic feedback. For example, localized haptic feedback can enable a user to feel what is being displayed by providing feedback when a user locates a virtual button, selects the virtual button and/or confirms the selection of the virtual button.

SUMMARY

Embodiments described herein relate to touch-based user interface devices that can both receive an input from a user and provide haptic feedback based on the input from the user. In one embodiment, a touch-based user interface device may include a haptic feedback layer that includes one or more piezoelectric actuators that are embedded in a nonconductive material. The haptic feedback layer may be the outermost layer of the touch-based user interface device so that the mechanical stimulation provided by the actuators can be felt by a user. However, in other embodiments, the haptic feedback layer may be covered by a protective coating or cover layer. In some embodiments, a printed circuit board layer may be positioned underneath the haptic feedback layer. The printed circuit board layer may include one or more metallic traces that are configured to supply a voltage to each of the piezoelectric actuators embedded in the haptic feedback layer. Some embodiments may also include input sensors, such as a displacement sensor and/or force sensor for recognizing and distinguishing between various touch-based input gestures from a user.

One embodiment may take the form of a touch-based user interface that includes a haptic feedback layer including one or more actuators configured to supply a haptic feedback. The one or more actuators may be embedded in a nonconductive material. The touch-based user interface may further include a printed circuit board layer underlying the haptic feedback layer. The printed circuit board layer may include one or more conductive traces configured to supply a voltage to the one or more actuators.

Another embodiment may take the form of a method for manufacturing a haptic feedback layer. The method may include arranging one or more piezoelectric actuators so that the one or more piezoelectric actuators are spaced apart from one another, and filing any spaces between the piezoelectric actuators with a nonconductive material.

Another embodiment may take the form of a method for manufacturing a haptic feedback layer. The method may include arranging one or more piezoelectric actuator strands so that the one or more piezoelectric actuator strands are spaced apart from one another, filling any spaces between the piezoelectric actuator strands with a nonconductive material to form a blank, and cutting the blank to form a haptic feedback layer.

BRIEF DESCRIPTION OF THE DRAWINGS

FIG. 3A illustrates a top down view of one embodiment of a touch-based user interface.

DETAILED DESCRIPTION

Embodiments described herein relate to touch-based user interface devices that can both receive an input from a user and provide haptic feedback based on the input from the user. In one embodiment, a touch-based user interface device may include a haptic feedback layer that includes one or more piezoelectric actuators that are embedded in a nonconductive material. The haptic feedback layer may be the outermost layer of the touch-based user interface device so that the mechanical stimulation provided by the actuators can be felt by a user. However, in other embodiments, the haptic feedback layer may be covered by a protective coating or cover layer. In some embodiments, a printed circuit board layer may be positioned underneath the haptic feedback layer. The printed circuit board layer may include one or more metallic traces that are configured to supply a voltage to each of the piezoelectric actuators embedded in the haptic feedback layer. Some embodiments may also include input sensors, such as displacement and/or force sensors for recognizing and distinguishing between various touch-based input gestures from a user.

The term "vertical" as used herein is defined as a plane perpendicular to the plane or surface of the haptic feedback layer, regardless of its orientation. The term "horizontal" refers to a direction perpendicular to the vertical direction just defined. Terms such as "above," "below," "bottom," "beneath," "top," "side," "higher," "lower," "upper," "over," and "under" (e.g., as in "underlying," "underneath," and so on) are defined with respect to the plane perpendicular to the plane or surface of the haptic feedback layer, regardless of its orientation. The term "outermost" refers to the surface positioned closest to a user engaging the surface. The term "outer," as in "outer surface," refers to any surface of an object, which can include the outermost surface.

Figure 1A:
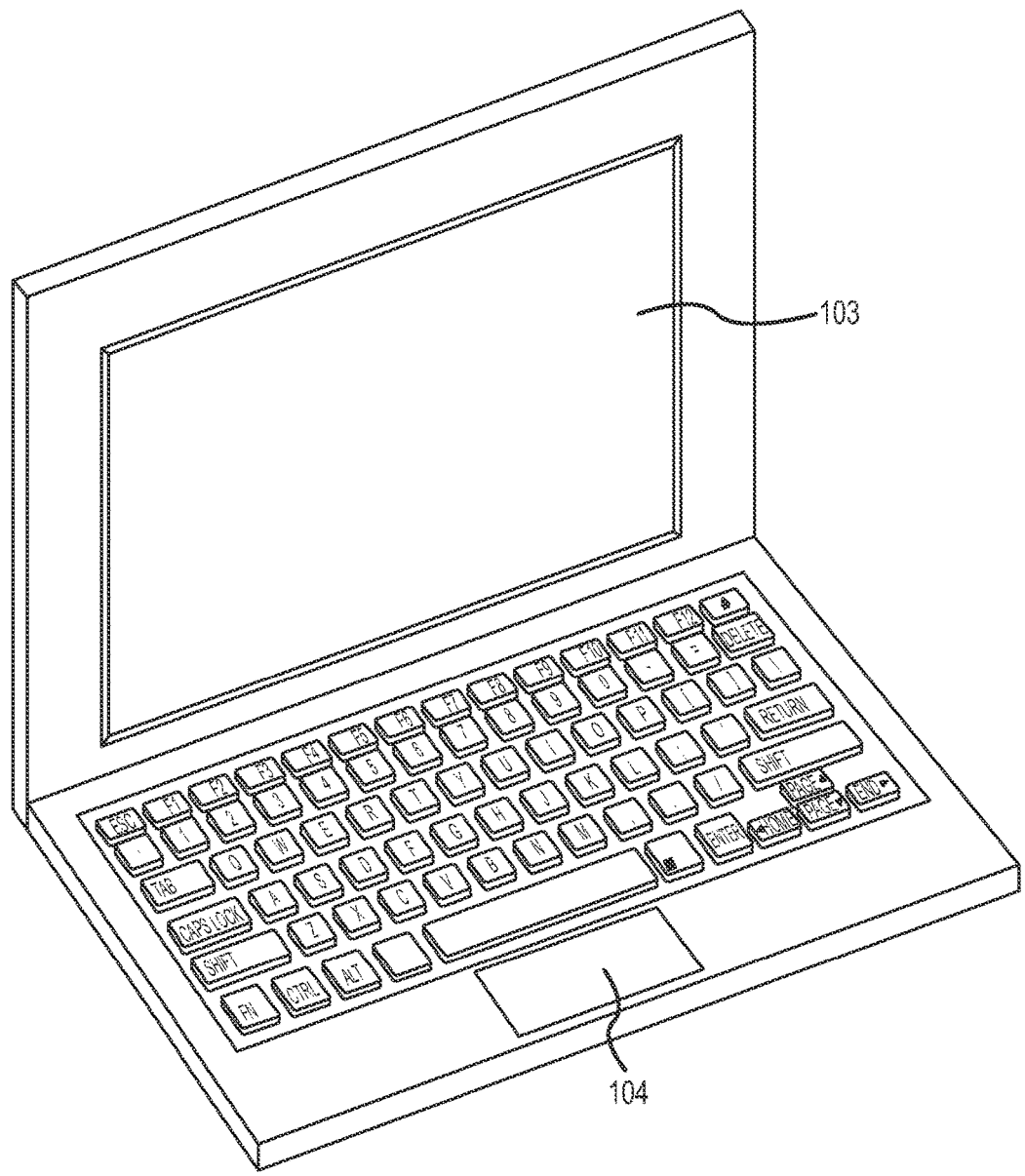
FIG. 1A illustrates one embodiment of an electronic device that incorporates an embodiment of a touch-based user interface.
Figure 1B:
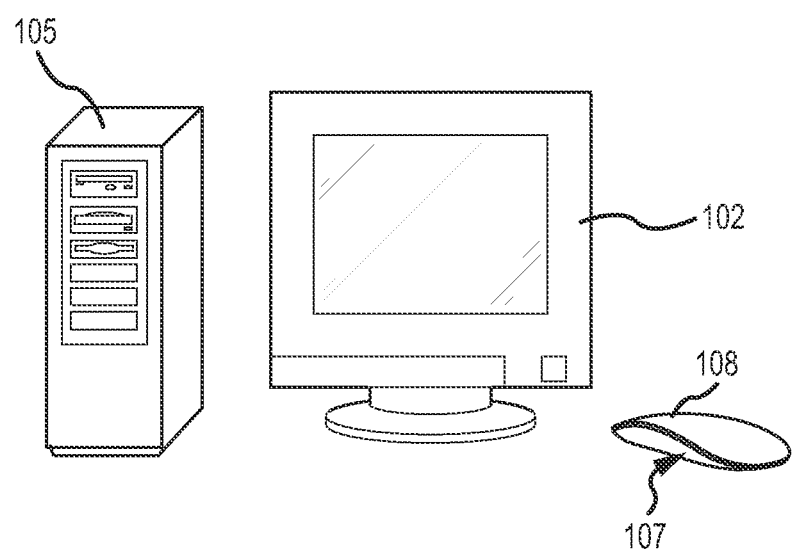
FIG. 1B illustrates another embodiment of an electronic device that incorporates an embodiment of a touch-based user interface.
Figure 1C:
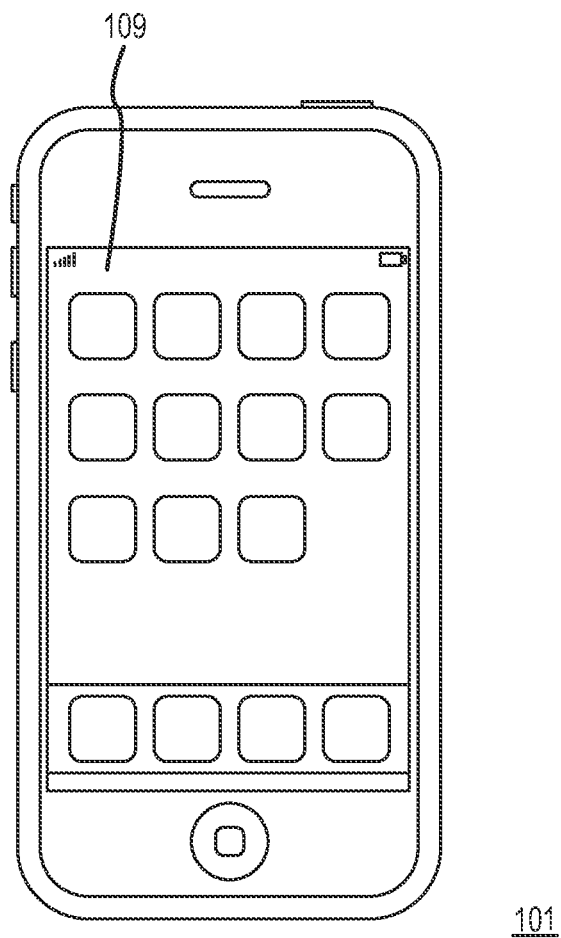
FIG. 1C illustrates another embodiment of an electronic device that incorporates an embodiment of a touch-based user interface.

FIGS. 1A-1C illustrate some examples of electronic devices that incorporate various embodiments of touch-based user interfaces. In one embodiment, shown in FIG. 1A, a laptop 111 may incorporate a trackpad 104 that serves as a user input-output (I/O) device. The trackpad 104 may be separate from the display screen 103 of the laptop 100.

As will be further described below, the trackpad 104 may include one or more input sensors that allow a user to interact with the laptop 111, as well as a surface capable of providing dynamic localized haptic feedback. In one embodiment, the trackpad 104 may be configured to sense various touch-based input gestures, such as swiping, taping, scrolling, and so on, applied across the surface of the trackpad 104. The touch-based input gestures may be applied by an object, such as a finger, a stylus, and so on. The input sensors may obtain information regarding the sensed gestures and transmit the information to a processing device provided in the laptop 111, which may translate the received information to a particular input command. As an example, the input sensors may derive distance and/or direction information regarding a sensed gesture, and the processing device may move a graphical pointer on the screen based on the received distance and/or direction information. As another example, the input sensors may be configured to sense a particular motion or pattern of motions and associate the sensed motion with a particular command. For example, a tap may be associated with a mouse click, while sliding the object along the trackpad in a particular manner may be associated with scrolling. The processing device may be any known processing device, including, but not limited to, a central processing unit (CPU), a microprocessor, a digital signal processor (DSP), a microcontroller, a graphics processing unit (GPU), and so on.

As discussed above, the trackpad 104 may be configured to provide haptic feedback based on the input gestures from the user. The haptic feedback may be used to enhance the user's interaction with the laptop 111 by providing mechanical stimulation to the user when the user is engaging the trackpad 104. For example, the haptic feedback may confirm the user's selection of a particular virtual icon or button, or may be provided when the user's cursor passes a selectable icon or button. Other embodiments may include other ways of providing haptic feedback to the user. The haptic feedback may be provided by one or more actuators configured to apply forces, vibration, and/or other motions to the object engaging the trackpad 104. As will be further discussed below, in one embodiment, the actuators may be distributed throughout the surface of the trackpad 104 so that a user may receive the feedback from different portions of the trackpad 104. In other embodiments, the actuators may only provided in certain sections of the surface of the trackpad 104, so that the user may only receive feedback when engaging those sections. As will be discussed below, the actuators may be piezoelectric actuators.

FIG. 1B illustrates another embodiment, in which the touch-based user interface may be incorporated into the housing of a mouse 108. One example of an existing mouse 108 incorporating such a touch-based user interface is Apple Inc.'s Magic Mouse™. The mouse 108 may include one or more sensors for detecting various touch-based input gestures, such as swiping, taping, single and two-finger scrolling, and so on, across the top surface 107 of the mouse 108 for allowing a user to interact with a desktop computer 105. In one embodiment, the top surface 107 of the mouse 108 may include a number of actuators that may provide haptic feedback to the user based on the user's interactions with the desktop computer 105. Like the trackpad 104 of the embodiment shown in FIG. 1A, the mouse 108 may be separate from the display screen 102 of the desktop computer 105.

In yet another embodiment, illustrated in FIG. 1C, the touch-based user interface may take the form of a touchscreen input component 106. The touchscreen input component 106 may be provided on an electronic device 101 that can function as, for example, a media device, a communications device, a digital camera, a video camera, a storage device, or any other electronic device. Some examples of electronic devices 101 incorporating touch-based user interfaces include Apple Inc.'s iPhone™ and iPad™. The electronic device 101 may include one or more sensors for detecting various touch-based input gestures, such as swiping, taping, scrolling, and so on, across a surface 109 overlaying the display screen of the electronic device 101 for allowing a user to interact with the device. In some embodiments, the surface 109 may include a number of actuators that may provide haptic feedback in response to the input gestures from the user.

Figure 2:
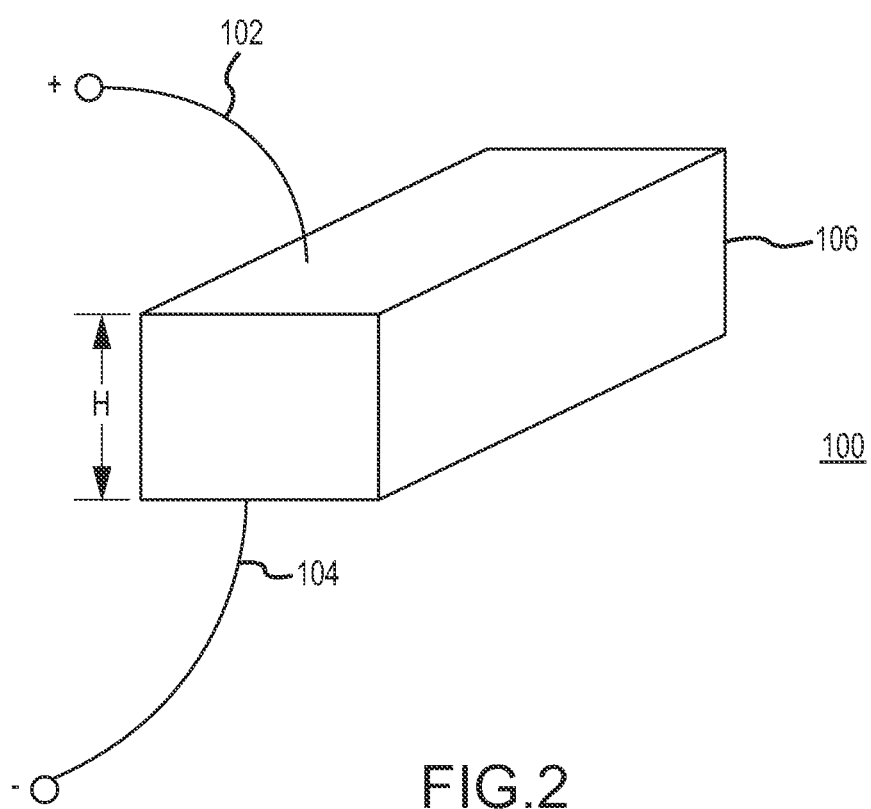
FIG. 2 illustrates a perspective view of a single piezoelectric actuator, as used in accordance with some embodiments.

FIG. 2 shows a perspective view of a single piezoelectric actuator 100, as used in accordance with some embodiments. As discussed above, the piezoelectric actuator 100 may provide some type of mechanical stimulation, such as a pulse, vibration, or other feedback, upon actuation. The surface area of actuator 100 can be, for example, 10 square millimeters, 10 square micrometers, 10 square nanometers, or any other size that is physically possible. Additionally, while the illustrated piezoelectric actuator 100 has a rectangular configuration, other embodiments may be other shapes. For example, the piezoelectric actuator may be circular, ovular, triangular, elongated strands, and so on and so forth.

The piezoelectric actuator 100 may include electrodes 102 and 104 and piezoelectric material 106, any or all of which can be transparent, opaque, or a combination thereof. The piezoelectric material 106 can include, for example, a ceramic, polyvinylidene fluoride, one or more natural crystals (such as, e.g., Berlinite, cane sugar, quartz, Rochelle salt, topaz, and/or any tourmaline group mineral(s)), man-made crystals (such as, e.g., Gallium orthophosphate or langasite), bone, polymers, and/or any other material that is able to mechanically deform in response to an applied voltage.

The piezoelectric material 106 may be connected to two electrodes 102 and 104. One of the electrodes 102 may be connected to a positive terminal of a voltage source and the other of the electrodes 104 may be connected to a negative terminal of a voltage source. When a sufficient voltage is applied across the electrodes 102 and/or 104, the piezoelectric material 106 can expand or contract in height (H). In other embodiments, the piezoelectric actuator 100 can be made to expand in other directions, such as in width, as opposed to height. The amount of voltage required to deform the piezoelectric material 106 may vary, and may depend on the type of piezoelectric material 106 used to manufacture the piezoelectric actuator 100. When no voltage is supplied by the voltage source, or when the voltage across the electrodes 102, 104 is less than the threshold amount of voltage required to deform the piezoelectric material 106, the piezoelectric material 106 may return to its original dimensions (i.e., the dimensions of the material in its undeformed state).

The magnitude of expansion or contraction of the piezoelectric material 106 may be determined by the level or amount of voltage across the electrodes 102, 104, with a larger amount of voltage corresponding to a higher magnitude of expansion or contraction. Additionally, the polarity of the voltage across the piezoelectric material 106 may determine whether the piezoelectric material 106 contracts or expands. For example, the piezoelectric material 106 may expand in response to a positive voltage and contract in response to a negative voltage. Alternatively, the piezoelectric material may contract in response to a positive voltage and expand in response to a negative voltage.

In one embodiment, the piezoelectric actuator 100 can be made to vibrate by applying a control signal to one or both of the electrodes 102 and 104 of the piezoelectric actuator 100. The control signal may be a wave having a predetermined amplitude and/or frequency. When the control signal is applied to one or both of the electrodes 102, 104, the piezoelectric actuator 100 may vibrate at the frequency of the control signal. The frequency of the control signal may be adjusted according to various embodiments to alter the rate of expansion and contraction of the piezoelectric actuators 100 if a more or less rapid vibration is desired. The amplitude of the control signal may be correlated to the magnitude of expansion or contraction of the piezoelectric material 106, and may be adjusted to alter the intensity of the vibration.

Figure 3B:
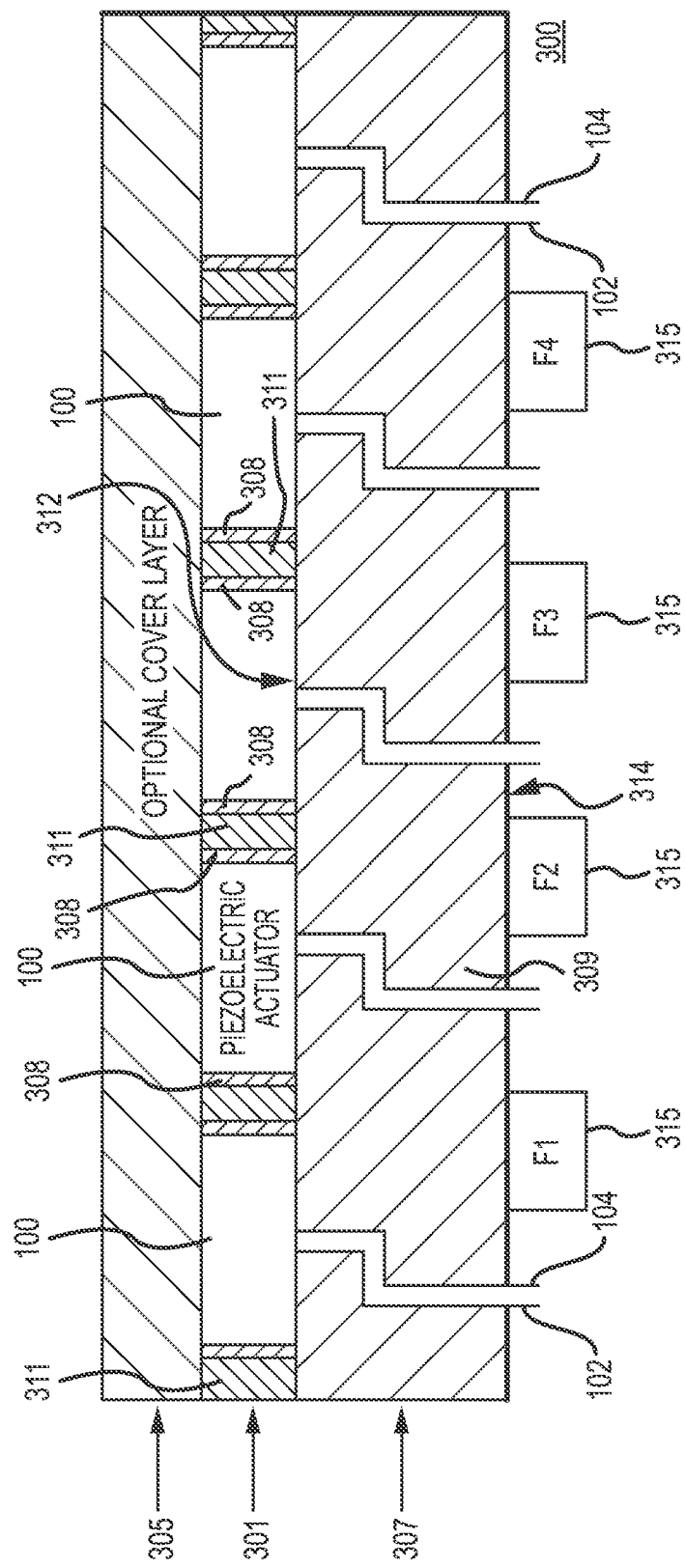
FIG. 3B illustrates a side cross-sectional view of the touch-based user interface shown in FIG. 3A, as taken along line 3B-3B.

FIG. 3A illustrates a top down view of one embodiment of a touch-based user interface 300. A cross-sectional view of the touch-based user interface 300 shown in FIG. 3A is illustrated in FIG. 3B. As shown in FIGS. 3A and 3B, the touch-based user interface 300 may include an optional cover layer 305, a haptic feedback layer 301, a printed circuit board ("PCB") layer 307, and one or more force sensors 315. In one embodiment, the optional cover layer 305 may be positioned above the haptic feedback layer 301, the PCB layer 307 may be positioned below the haptic feedback layer 301, and the force sensors 315 may be positioned below the PCB layer 307. Other embodiments may include other arrangements of the haptic feedback layer 301, the PCB layer 307, force sensors 315 and cover layer 305. For example, in one embodiment, the haptic feedback layer 301 may be positioned underneath the PCB layer 307. Another embodiment may not include a cover layer 305. Instead, the haptic feedback layer 301 may form the outermost surface of the touch-based user interface 300. In a further embodiment, the force sensors 315 may be positioned above the haptic feedback layer 301.

In one embodiment, the haptic feedback layer 301 may include one or more piezoelectric actuators 100 embedded in a nonconductive material 311. Each of the piezoelectric actuators 100 in the haptic feedback layer 301 may be the same as or similar to the piezoelectric actuator 100 shown and described in FIG. 2. In one embodiment, each piezoelectric actuator 100 may be individually controlled. In other embodiments, two or more piezoelectric actuators 100 can be grouped together and controlled as a single entity. For example, two or more piezoelectric actuators can be grouped together to represent a single virtual button. In further embodiments, any number of piezoelectric actuators 100 can be grouped to form a single entity.

One skilled in the art will appreciate that, despite the actuators shown in FIGS. 3A and 3B having the same physical dimensions, the piezoelectric actuators can be any size, or combination of sizes. For example, the piezoelectric actuators can be larger around the edges of the touch-based user interface 300 and proportionately smaller towards the middle of the touch-based user interface 300. One skilled in the art would also appreciate that the space between piezoelectric actuators and/or the piezoelectric actuators' piezoelectric material can also be adjusted accordingly.

As shown in FIGS. 3A and 3B, the piezoelectric actuators 100 may be embedded into the haptic feedback layer 301 in any configuration. For example, as shown in FIG. 3A, the piezoelectric actuators 100 may be arranged in a grid configuration to form a plurality of rows and columns. The number of rows and columns of piezoelectric actuators 100 on the touch-based user interface 300 may vary according to different embodiments. For example, one embodiment may include more rows than columns, while another embodiment may include equal numbers of rows and columns, and so on and so forth.

The piezoelectric actuators 100 may be embedded in a nonconductive material 311 that may serve to insulate the actuators 100 and separate the actuators 100 from one another. The nonconductive material 311 may be an inorganic or rigid material that has a sufficiently high modulus of rigidity to resist deformation when the embedded piezoelectric actuators 100 deform in response to a supplied voltage. In this embodiment, the nonconductive material 311 may maintain the same dimensions as the attached actuators 100 increase and decrease in height relative to the nonconductive material 311. Some examples of inorganic materials that may be used include glass, ceramic, plastic, and so on and so forth. In other embodiments, the nonconductive material 311 may be an organic or compliant material that has a sufficiently high modulus of elasticity to deform with the attached embedded piezoelectric actuators 100. In this embodiment, the nonconductive material 311 may increase and decrease in height as the attached embedded actuators 100 increase and decrease in height. Some examples of organic materials that may be used include elastomers, silicon, thermoplastics, and so on and so forth.

In one embodiment, the piezoelectric actuators 100 may be bonded to the nonconductive material 311 by an adhesive 308. For example, the adhesive 308 may be applied around at least a portion of the perimeter of the piezoelectric actuators 100 to bond the actuators to the nonconductive material 311. In some embodiments, the adhesive 308 may have a high modulus of elasticity so as to allow the piezoelectric actuators 100 to move relative to the nonconductive material 311 while resisting debonding of the actuators 100 and the nonconductive material, as well as cracking or wear of the adhesive itself. Some examples of suitable adhesives include, but are not limited to, a thermoplastic adhesive, a hot melt adhesive, a solvent-based adhesive, and so on and so forth.

The properties of the adhesive 308 may vary according to the properties of the nonconductive material 311 used to form the haptic feedback layer 301. For example, an adhesive having a higher modulus of elasticity may be more suitable for embodiments utilizing a rigid nonconductive material 311 that resists deformation as the embedded piezoelectric actuators 100 are deformed. In contrast, an adhesive having a lower modulus of elasticity may be more suitable for embodiments utilizing a compliant or elastic nonconductive material 311 that is deformed with the embedded piezoelectric actuators 100.

As discussed above, a PCB layer 307 may be positioned underneath the haptic feedback layer 301. The PCB layer 307 may include a nonconductive matrix 309 configured to support the electrodes 102, 104 corresponding to each of the piezoelectric actuators 100. As shown in FIG. 3B, in one embodiment, each pair of electrodes 102, 104 may be positioned directly beneath a corresponding piezoelectric actuator so that each of the electrodes 102, 104 is aligned with a corresponding actuator 100 along at least one vertical axis. However, in other embodiments, the electrodes may not be vertically aligned with a corresponding actuator 100. For example, in one embodiment, one or both of the electrodes 102, 104 may be positioned to one side of a corresponding actuator 100.

In one embodiment, the electrodes 102, 104 may take the form of conductive metallic traces that are embedded within the nonconductive matrix 309. As shown in FIG. 3B, the top ends of the metallic traces may contact the piezoelectric actuators 100, and the metallic traces may extend from a top surface 312 of the PCB layer 307 through a bottom surface 314 of the PCB layer. The metallic traces may be formed from any suitable electrically conductive material, including, but not limited to, copper, aluminum, silver, gold, iron, and so on and so forth. In other embodiments, the electrodes 102, 104 may be insulated wires, rather than uninsulated traces.

The nonconductive matrix 309 may be formed from any non-conductive material, including an low-temperature co-fired ceramic, an elastomer-based polymer, glass, Teflon, and so on and so forth. In one embodiment, the nonconductive matrix 309 may be formed from a rigid or semi-rigid material that may provide structural support to the haptic feedback layer 301. For example, the nonconductive matrix 309 may prevent the haptic feedback layer 301 from cracking when depressed. The nonconductive matrix 309 may completely surround each of the electrodes 102, 104 so as to insulate the individual electrodes and prevent contact between adjacent electrodes. However, in other embodiments, such as where insulated wires are used rather than uninsulated traces, the nonconductive matrix 309 may only partially surround each of the electrodes 102, 104.

In some embodiments, the haptic feedback layer 301 may be fully or partially covered by an optional cover layer 305. The optional cover layer 305 may serve to insulate and protect the haptic feedback layer 301 from wear. The cover layer 305 may be sufficiently thin so as to allow a user to feel the forces supplied by the actuators 100. In one embodiment, the optional cover layer 305 may be formed from a transparent nonconductive material, such as glass, a clear cosmetic glaze, plastic, and so on. However, in other embodiments, the cover layer 305 may be formed from a fully or partially opaque material, such as a ceramic or an opaque paint. In another embodiment, the cover layer 305 may be a clear material that is sprayed or otherwise coated by an opaque paint. For example, the cover layer 305 may be a glass layer that is coated in paint.

As alluded to above, the touch-based user interface 300 may also include one or more force sensors 315. In one embodiment, the force sensors 315 may be located beneath the PCB layer 307. However, in other embodiments, the force sensors 315 may be positioned above the haptic feedback layer 301 or embedded into the PCB layer 307 or the haptic feedback layer 301. The force sensors 315 may be capable of sensing the amount of force or pressure being exerted on the sensors. When a force is applied to the touch-based user interface 300, the force may be transmitted through the outer layers of the interface to a force sensor underneath. Some examples of force sensors 315 that may be used in conjunction with the touch-based user interface may include, but are not limited to, force sensitive resistors, force sensitive capacitors, load cells, pressure plates, piezoelectric transducers, strain gauges, and so on and so forth.

In one embodiment, the force sensors 315 may be positioned underneath or incorporated into the outermost surface of the touch-based user interface 300. In this embodiment, the outermost surface of the touch-based user interface 300 may allow for a slight amount of flex so that any forces on the surface can be distributed to a respective force sensor. Accordingly, when a force is applied to the touch-based user interface 300, for example, due to squeezing or pushing on the outermost surface, the force may be transmitted through the outermost surface to a force sensor 315 located underneath the outermost surface. That is, the outermost surface may flex minimally, but still enough to be sensed by the force sensor 315 embedded in the outermost surface or sandwiched between the outermost surface and another intermediate layer of the touch-based user interface 300.

The force sensors 315 may produce signals indicative of the sensed forces. In one embodiment, the sensors 315 may be configured to generate input signals when forces are applied to the touch-based user interface 300. The processing device of the electronic device may then process the input signals to distinguish between various touch-based input gestures and initiate commands according to the different input gestures. Accordingly, the force sensors 315 may allow for distinguishing between various input gestures that may be associated with different commands. In one embodiment, the force sensors may be used to differentiate between a click and a scroll command. As an example, the processing device may associate a higher amount of force, such as from a tapping motion, with a click command and a lower amount of force, such as from a gliding motion, with a scroll command (or vice versa). Accordingly, if the force measured by the force sensors 315 is over a threshold level of force, the input gesture may be interpreted as a click command. On the other hand, if the force measured by the force sensors 315 is less than the threshold level of force, the input gesture may be interpreted as a scroll command.

Figure 4A:
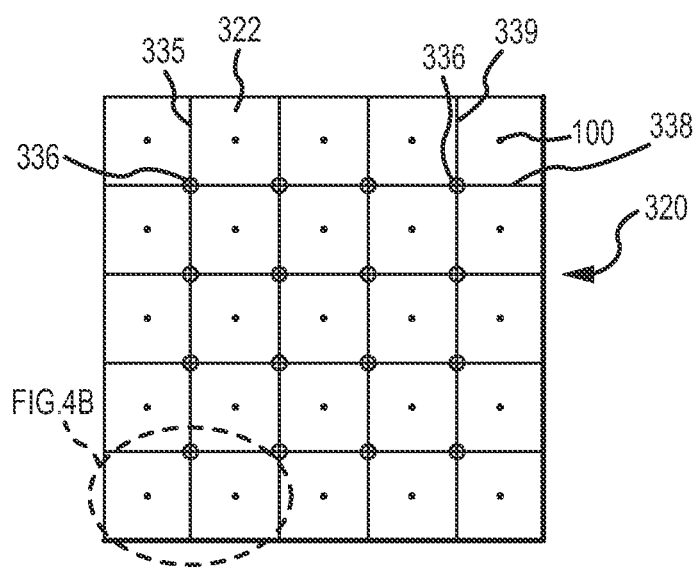
FIG. 4A illustrates a top down view of one embodiment of a displacement sensor overlaying one or more piezoelectric actuators.
Figure 4B:
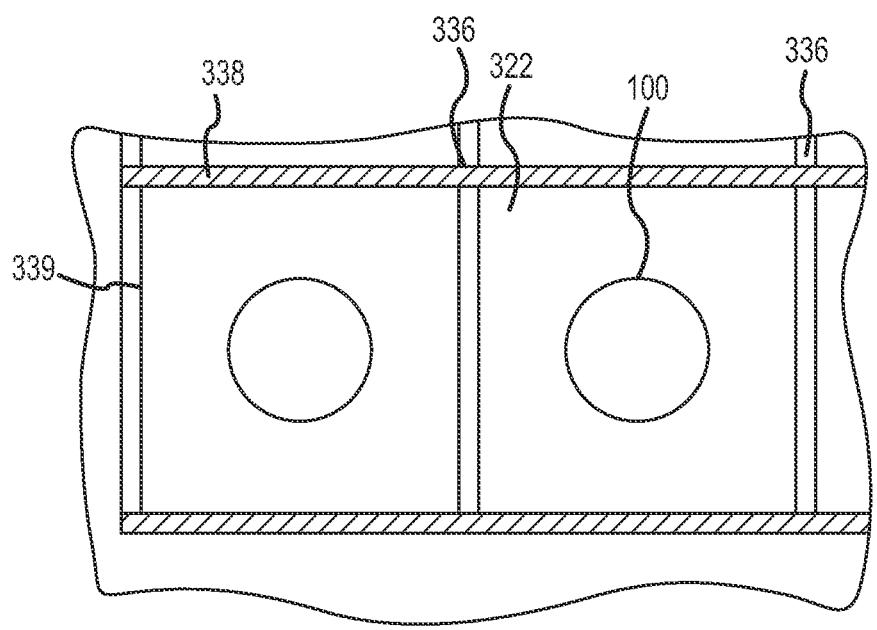
FIG. 4B illustrates a close up and partially cut-away view of the embodiment shown in FIG. 4A.
Figure 4C:
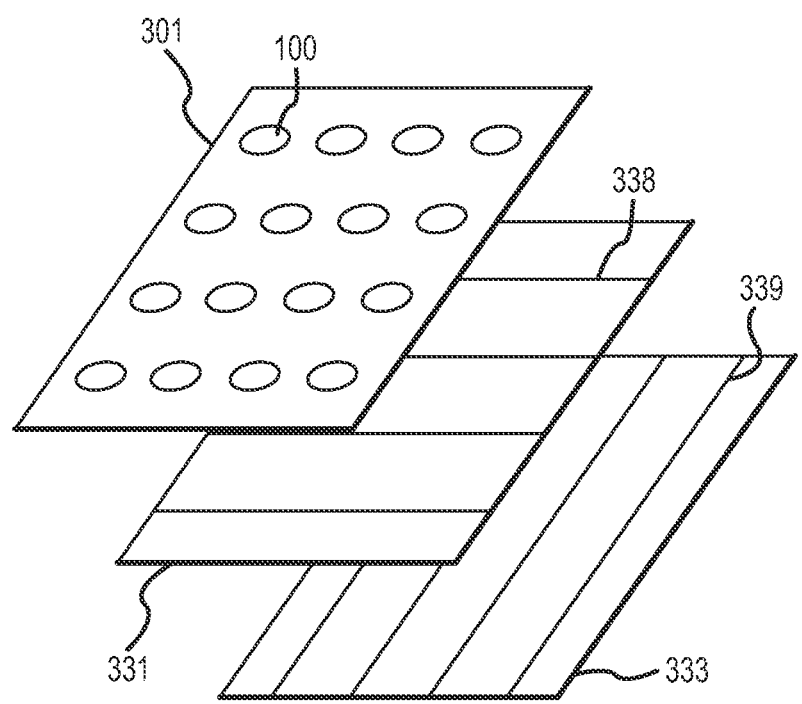
FIG. 4C illustrates an exploded view of the embodiment shown in FIG. 4A.

The touch-based user interface 300 may also include a displacement sensor that may derive spatial data relating to the position of the object on the interface, as well as proximity data relating to the distance of the object from the interface. In one embodiment, illustrated in FIGS. 4A-4C, the displacement sensor may be a capacitance sensor 320 that can detect the location of a finger (or other object) using mutual capacitance sensing. In one embodiment, the capacitance sensor 320 may be incorporated into the PCB layer 307 underlying the haptic feedback layer 301. However, in another embodiment, the capacitance sensor 320 may be sandwiched between the haptic feedback layer 301 and the PCB layer 307. In other embodiments, the capacitance sensor 320 may be incorporated into any layer of the touch-based user interface 300 described above, or may be an additional layer that is positioned above or below the other layers of the interface 300 or sandwiched between two layers of the interface 300.

In one embodiment, the capacitance sensor 320 may include electrically conductive electrodes 335 that are deposited in varying patterns onto two flexible substrate sheets 331, 333. The substrate sheets 331, 333 may be formed from a flexible, yet rigid nonconductive material, such as plastic, polyester, rubber, glass, and so on and so forth. In one embodiment, the electrodes 335 may be deposited on the inner surface of one sheet 331 to form a row pattern, and on the corresponding inner surface of the other sheet 333 to form a column pattern. The spacing between the rows 338 and columns 339 may vary according to different embodiments, with a smaller spacing size corresponding to a more sensitive capacitive sensor 320. When the two substrate sheets are positioned with one on top of the other with the electrodes facing one another, a grid pattern may be formed. A finger, or other object, placed near the intersection 336 of two electrodes modifies the capacitance between them. This change in capacitance can be measured, and the position of the finger may be determined based on these changes at various points along the capacitance sensor.

In one embodiment, the piezoelectric actuators 100 may be embedded in the haptic feedback layer 301 so that the actuators 100 are aligned with the grid pattern formed by the electrodes 335 of the capacitance sensor 320. For example, the piezoelectric actuators 100 may be positioned above the spaces 322 defined between the rows 338 and columns 339 of the grid so that the spaces 322 and the actuators 100 are aligned along at least one vertical axis. As a change in capacitance is detected at a particular intersection 336 or group of intersections, a voltage may be supplied to the actuator 100 or group of actuators positioned proximate the intersections 336. The piezoelectric actuators 100 may or may not be positioned above every space of the grid. For example, a single piezoelectric actuator 100 may be provided for every other space of the grid or every third space of the grid. In another embodiment, multiple piezoelectric actuators 100 may be provided for some spaces.

As discussed above, the haptic feedback from the piezoelectric actuators 100 may allow for enhanced navigation of the content displayed on a display coupled to the touch-based user interface. In one embodiment, the piezoelectric actuators 100 may replace the mechanical "click" of a mouse, trackpad, or other user interface of an electronic device. For example, the touch-based user interface may confirm a "click" by supplying a voltage to the piezoelectric actuators 100 so that the user feels a vibration or other motion. In one embodiment, the electronic device may interpret a tapping motion on the surface of the touch-based user interface as corresponding to a click command. In contrast, when the user glides a finger or other object along the surface of the touch-based user interface, the piezoelectric actuators 100 may remain unactuated. Accordingly, a user may be able to ascertain whether the electronic device has interpreted an input gesture as a click or a scroll.

In another embodiment, the piezoelectric actuators 100 may allow the user "feel" the selectable buttons or icons displayed by the electronic device. This embodiment may be particularly useful in a touch-based user interface that is not overlaid on a display screen, such as a trackpad or a mouse, in which the user cannot position a finger or other object directly over the displayed buttons and icons to select them. In one implementation, a voltage may be supplied to the piezoelectric actuators 100 when a cursor is positioned within selection range of a virtual button or icon. Accordingly, the user may feel a vibration or other motion indicating that the user may select the button with a selection input gesture.

Figure 5A:
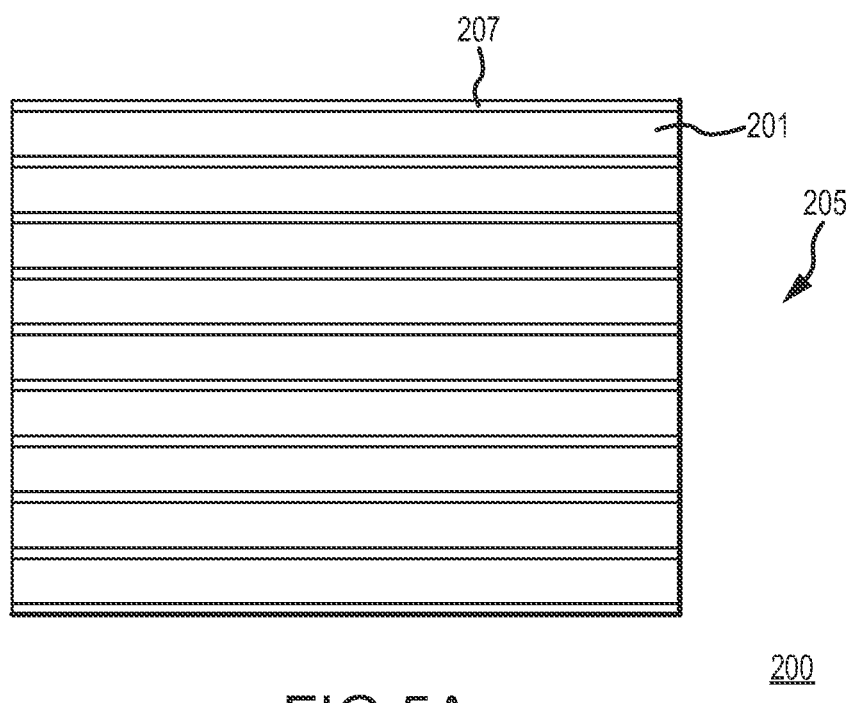
FIG. 5A illustrates a top down view of another embodiment of a touch-based user interface.
Figure 5B:
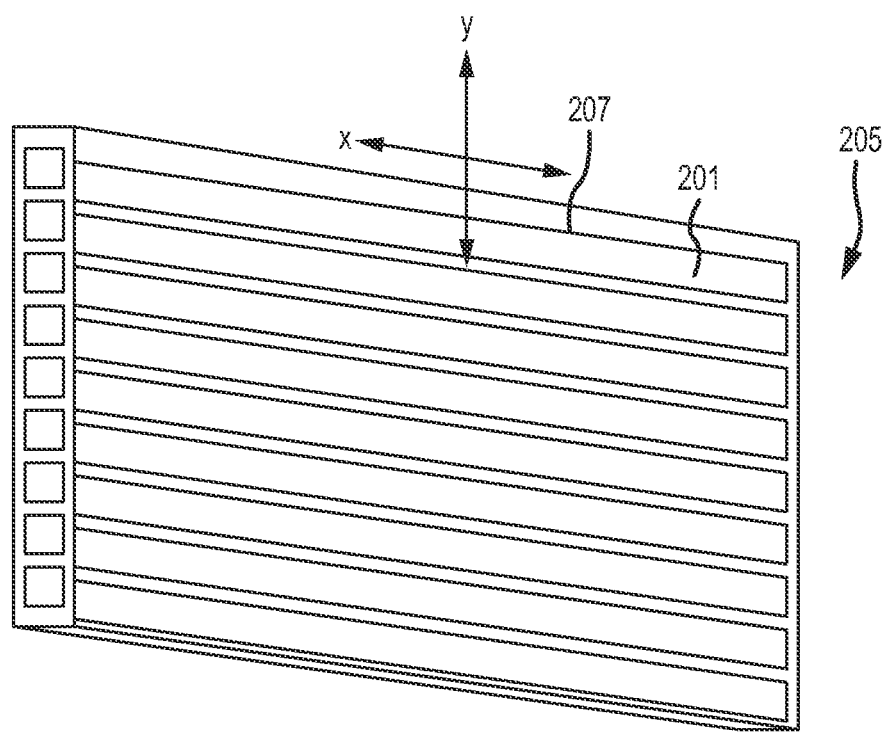
FIG. 5B illustrates a perspective view of the embodiment of the touch-based user interface shown in FIG. 5A.

FIGS. 5A and 5B illustrate a top down view and a perspective view of another embodiment of a touch-based user interface 200. In this embodiment, the piezoelectric actuators 201 may take the form of one or more strands 203 that extend laterally across the haptic feedback layer 205. In one embodiment, the strands 203 may be parallel to one another, and may extend in a horizontal direction across the haptic feedback layer 205. In this embodiment, the electrically conductive traces connected to the strands 203 may be positioned on the sides of the haptic feedback layer 203, as opposed to underneath the haptic feedback layer 203 as in the embodiment shown in FIGS. 3A and 3B. The strands 203 may be embedded in the nonconductive material 207 such that the strands 203 are exposed and form part of the outer surface of the haptic feedback layer 205. Alternatively, the strands 203 may be covered by the nonconductive material 207.

In other embodiments, the traces may be positioned underneath the strands 203. In further embodiments, the strands 203 may not be parallel to one another, but may extend at angles with respect to one another. Additionally, the strands 203 may extend vertically or diagonally across the haptic feedback layer 205, rather than horizontally.

Figure 6A:
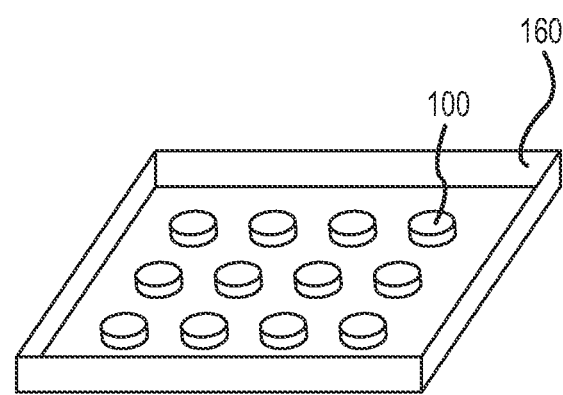
FIG. 6A illustrates a perspective view of a sample embodiment shown in FIGS. 3A and 3B, shown during manufacturing of the embodiment before an adhesive is applied around the edges of the piezoelectric actuators.
Figure 6B:
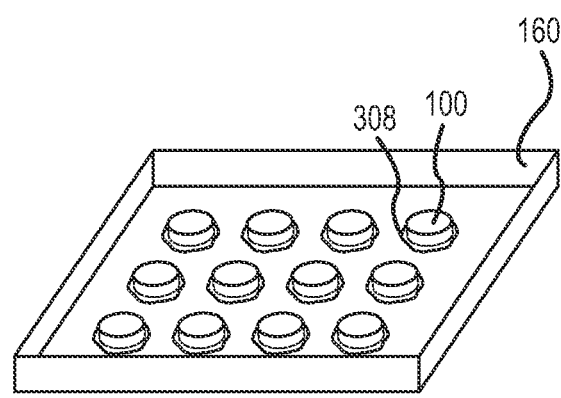
FIG. 6B illustrates a perspective view of the sample embodiment of FIGS. 3A and 3B, shown during manufacturing of the embodiment before nonconductive material is added to the mold.
Figure 6C:
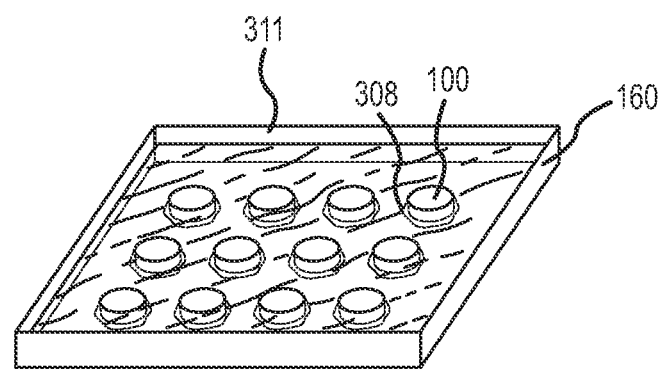
FIG. 6C illustrates a perspective view of the sample embodiment of FIGS. 3A and 3B, shown during manufacturing of the embodiment after the spaces between the piezoelectric actuators have been filled with nonconductive material.

FIGS. 6A-6C illustrate one embodiment of a method for manufacturing a haptic feedback layer. In a first step, illustrated in FIG. 6A, one or more piezoelectric actuators 100 may be arranged in a mold 160. The mold 160 may define the shape of the formed haptic feedback layer. The actuators 100 may be arranged in any configuration. For example, the actuators 100 may be evenly spaced apart in the mold 160, or concentrated in one portion of the mold. The actuators 100 may have any shape. For example, the actuators may have a circular shape, a square shape, a triangular shape, or any other shape. The actuators may all be substantially identical, or some actuators may have a different configuration than other actuators.

In a second step, illustrated in FIG. 6B, an adhesive 308 may be applied around all or a portion of the perimeter of the piezoelectric actuators 100. As discussed above, the adhesive 308 may bind the piezoelectric actuators 100 to the nonconductive material. In one embodiment, the adhesive 308 may be a hot melt adhesive that is applied around the perimeter of the actuators. Other embodiments may use other types of adhesive, as discussed above. In an alternate embodiment, the adhesive 308 may be applied after the nonconductive material is added to the mold. For example, the actuators 100 may be spaced apart from the nonconductive material, and the adhesive may be added after nonconductive portion of the blank is formed. Additionally, some embodiments may not include an adhesive layer between the nonconductive material and the piezoelectric actuators 100. Accordingly, the adhesive application step described above is optional.

In a third step, illustrated in FIG. 6C, a nonconductive material 311 may added to the mold to fill the spaces between the piezoelectric actuators 100. In one embodiment, the nonconductive material 311 may be heated to a liquid form and then poured into the mold 160 to fill the spaces between the actuators 100. In another embodiment, the nonconductive material 311 may be added to the mold 160 in solid form, and the actuators and the nonconductive material may be heated to melt the nonconductive material 311 so that it fills the spaces between the actuators 100. After the nonconductive material 311 is added to the mold 160, the composite layer may be heated, baked, or otherwise processed to form the final haptic feedback layer 301.

In one embodiment, both the nonconductive material and the actuators may each define a portion of the outer surface of the haptic feedback layer. However, in other embodiments, the nonconductive material 311 may cover all or part of the actuators 100 to form one or more of the side, top and/or bottom surfaces of the haptic feedback layer. Accordingly, in one embodiment, the nonconductive material may define the outer surfaces of the haptic feedback layer, or the actuators may define a portion of one outer surface of the haptic feedback layer, while the other surfaces are defined by the nonconductive material.

Figure 7A:
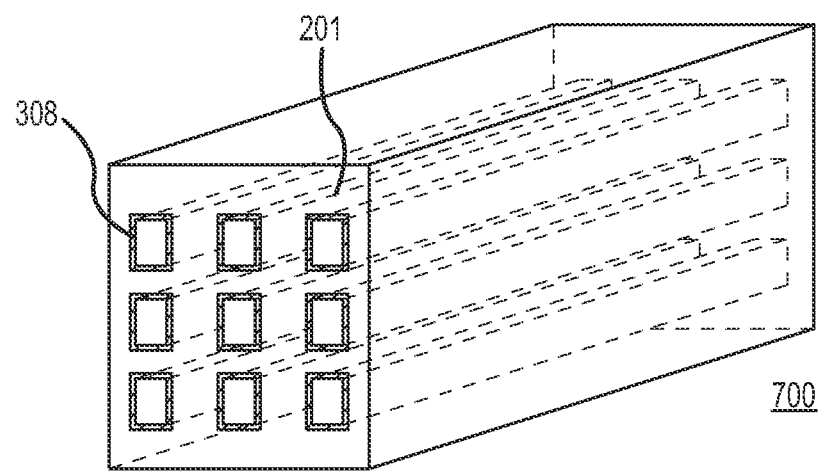
FIG. 7A illustrates a perspective view of the sample embodiments shown in FIGS. 3A and 3B and FIGS. 5A and 5B, shown during manufacturing of these embodiments from a composite blank before the composite blank is cut.
Figure 7B:
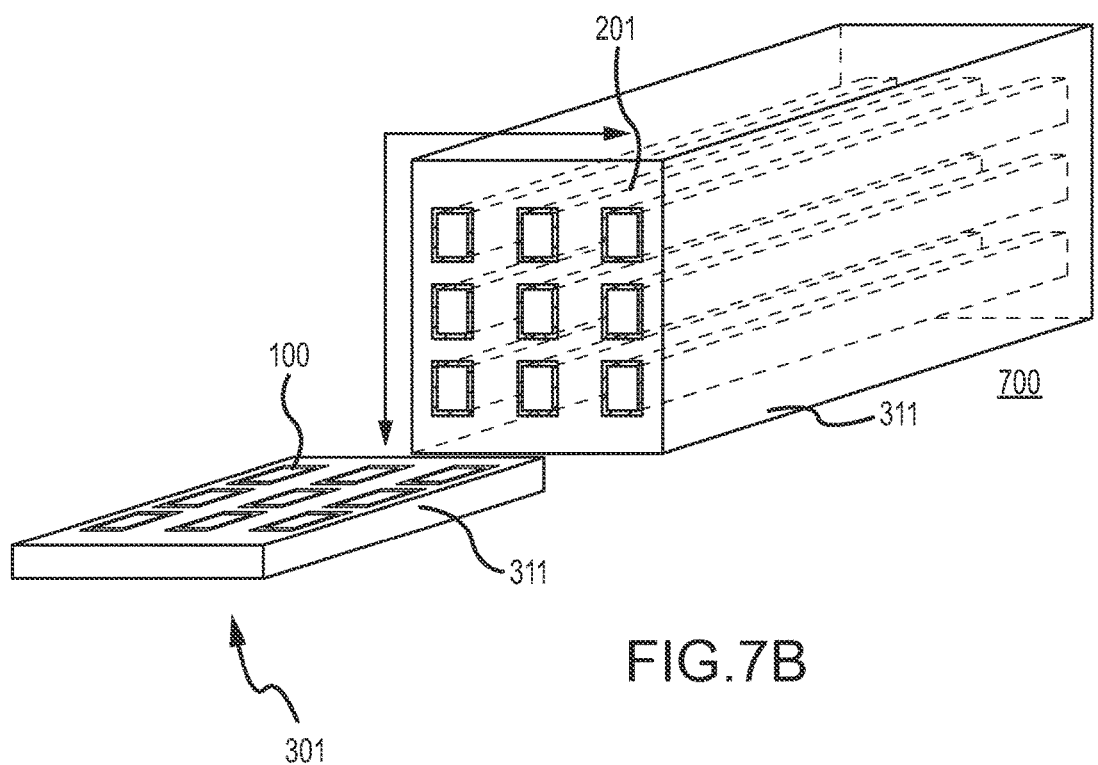
FIG. 7B illustrates a perspective view of a sample embodiment shown in FIGS. 3A and 3B, shown during manufacturing of the embodiment after the composite blank is cut.
Figure 7C:
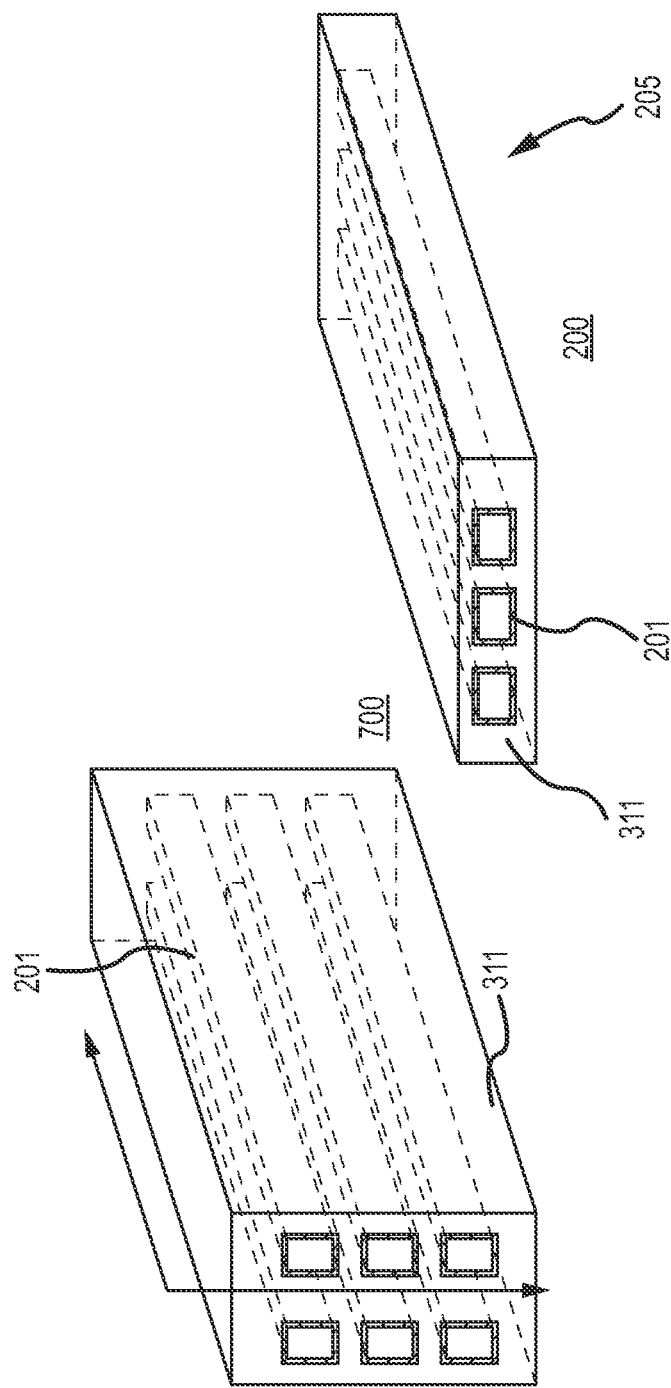
FIG. 7C illustrates a perspective view of a sample embodiment shown in FIGS. 5A and 5B, shown during manufacturing of the embodiment after the composite blank is cut.

FIGS. 7A-7C illustrate another embodiment of a method for manufacturing a haptic feedback layer. In particular, FIG. 7A illustrates a perspective view of a composite blank 700 that may be used to form a haptic layer of a touch-based user interface. As shown in FIG. 7A, the composite blank may include one or more piezoelectric strands 201 that are conjoined with a nonconductive material 311. The strands 201 may have any cross-sectional configuration. For example, the strands may have a circular cross-section, a rectangular cross-section, a square cross-section, a triangular cross-section, and so on and so forth. In one embodiment, the piezoelectric strands may be parallel to one another such that the strands form one or more rows and one or more columns within the composite blank. However, in other embodiments, the piezoelectric strands may extend at angles from one another. As discussed above, the side surfaces of the piezoelectric strands may be joined to the nonconductive material by an adhesive material 308.

The composite blank 700 may be formed in a manner similar to that described with respect to the method for forming a haptic layer illustrated in FIGS. 6A-6C. That is, the composite blank 700 may be formed by arranging the piezoelectric strands 201 in an array configuration, and then filling the spaces between the strands with a nonconductive material 311. The array of strands may first be arranged in a mold defining the shape of the blank.

As discussed above, the spaces between the strands of the array may then be filled with the nonconductive material 311. In one embodiment, the nonconductive material 311 may be heated to a liquid state, and then poured over the array of piezoelectric strands 201. In other embodiments, the nonconductive material, in solid form, may be placed around the piezoelectric strands, and the strands and the nonconductive material may be heated so that the nonconductive material is melted and fills the gaps between the strands. In one embodiment, adhesive 308 may be applied to the side edges of the strands before the nonconductive material is added to the mold.

The formed composite blank 700 may then be cut to form different configurations of touch-based user interface devices. In one embodiment, shown in FIG. 7B the blank may be cut along a plane perpendicular to the direction of extension of the strands to form a haptic feedback layer 301 similar to that shown in FIGS. 3A and 3B, with the shape of the piezoelectric actuators 100 varying according to the cross-sectional profile of the strands 201. The blank may be cut using, for example, a computer-numerical controlled laser cutting tool, or alternatively, a mechanical cutting tool such as a blade. In another embodiment, shown in FIG. 7C, the blank 700 may be cut along a plane parallel to the direction of extension of the strands 201 form a haptic feedback layer 205 similar to that shown in FIGS. 5A and 5B. For example, the blank may be cut along the nonconductive areas between the strands so that the piezoelectric strands of the resulting touch-based user interface are covered by the nonconductive material. Alternatively, the blank may be cut to expose the strands 201 so that the strands form at least part of the outer surface of the resulting haptic feedback layer 205.

Figure 8:
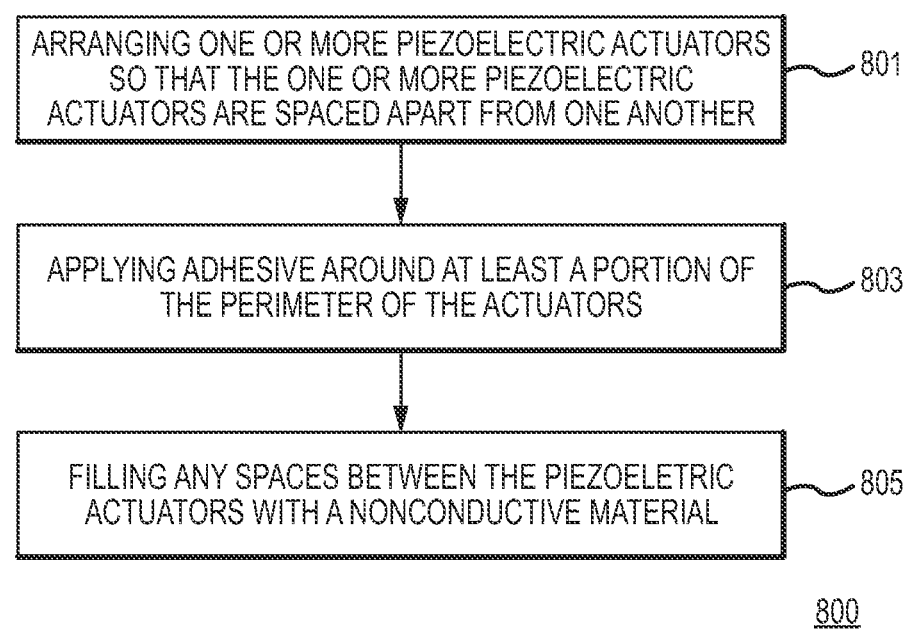
FIG. 8 is a flowchart setting forth a method for manufacturing a haptic feedback layer.

FIG. 8 is a flowchart illustrating one embodiment of a method 800 for manufacturing a haptic feedback layer. For example, the illustrated method 800 may be used to form an embodiment similar to that shown in FIGS. 3A and 3B. The method 800 may begin by arranging one or more piezoelectric actuators in a spaced-apart configuration, as indicated in block 801. As discussed above, the mold may define the shape of the formed haptic feedback layer. The actuators may be arranged in any configuration. For example, the actuators may be evenly spaced apart in the mold, or concentrated in one portion of the mold.

An adhesive may then be applied around at least a portion of the perimeter of the piezoelectric actuators, as indicated in block 803. As discussed above, the adhesive may bind the piezoelectric actuators to the nonconductive material. In some embodiments, the adhesive may have a high modulus of elasticity so as to allow the piezoelectric actuators to move relative to the nonconductive material while resisting debonding of the actuators and the nonconductive material, as well as cracking or wear of the adhesive itself.

The spaces between the actuators may be filled with a nonconductive material, as indicated in block 805. As discussed above, in one embodiment, the nonconductive material may be heated into liquid form and poured into the mold to fill the spaces between the actuators. In other embodiments, the nonconductive material may be inserted into the mold in solid form, and the actuators and the nonconductive material may be heated so that the nonconductive material fills the spaces between the actuators.

Figure 9:
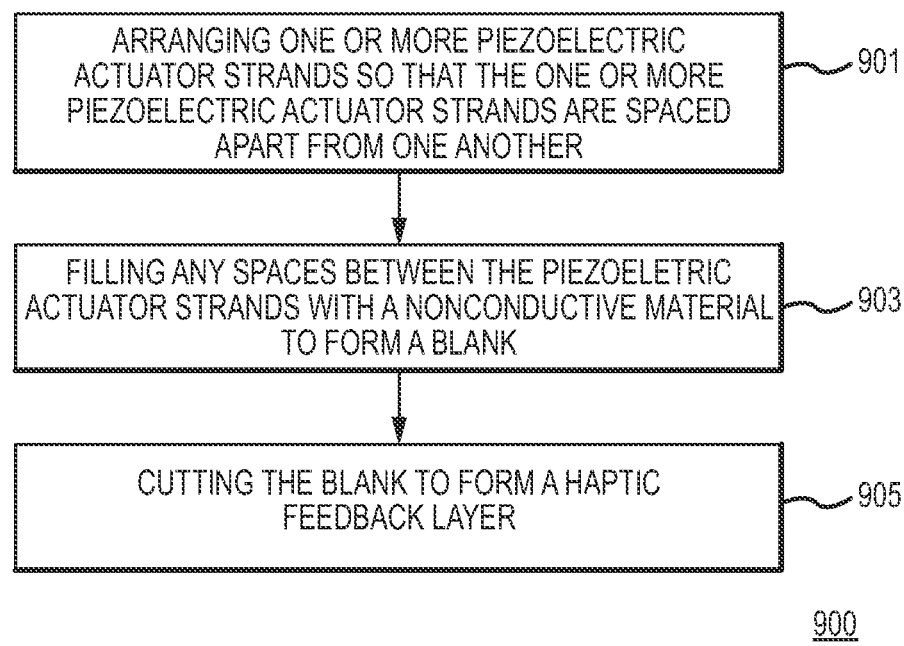
FIG. 9 is a flowchart setting forth a method for manufacturing a haptic feedback layer.

FIG. 9 is a flowchart illustrating another embodiment of a method 900 for manufacturing a haptic feedback layer. For example, the illustrated method 900 may be used to form embodiments similar to that shown in FIGS. 3A and 3B and FIGS. 5A and 5B. The method 900 may begin by arranging one or more piezoelectric strands in a spaced-apart configuration, as indicated in block 901. As discussed above, the spacing between the strands and the configuration of the strands may vary according to different embodiments. The strands may first be arranged in a mold defining the shape of the blank. The spaces between the strands may then be filled with a nonconductive material to form a composite blank, as indicated in block 903. As discussed above, the nonconductive material may be heated into liquid form and poured into the mold to fill the spaces between the strands. In other embodiments, the nonconductive material may be inserted into the mold in solid form, and the strands and the nonconductive material may be heated so that the nonconductive material fills the spaces between the strands.

The composite blank may then be cut, as indicated in block 905. As discussed above, in one embodiment, the composite blank may be cut along a plane perpendicular to the direction of extension of the strands. In another embodiment, the composite blank may be cut along a plane parallel to the direction of extension of the strands so that the formed haptic feedback layer includes one or more strands extending across it. The strands may be exposed, so that the strands form a portion of the outermost surface of the haptic feedback layer, or may be covered by the nonconductive material.

The order of execution or performance of the methods illustrated and described herein is not essential, unless otherwise specified. That is, elements of the methods may be performed in any order, unless otherwise specified, and that the methods may include more or less elements than those disclosed herein. For example, it is contemplated that executing or performing a particular element before, contemporaneously with, or after another element are all possible sequences of execution.

The invention claimed is:

1. A touch-based user interface, comprising:
a haptic feedback layer comprising a layer of nonconductive material and one or more actuators embedded within the layer of nonconductive material, the one or more actuators configured to supply a haptic feedback;
one or more force sensors configured to differentiate among a plurality of input commands based, at least in part, on an amount of force sensed by the one or more force sensors; and
a printed circuit board layer, disposed on a first side of the haptic feedback layer, and positioned between the haptic feedback layer and the one or more force sensors, the printed circuit board layer including one or more conductive traces configured to supply a voltage to the one or more actuators, wherein
a second side of the haptic feedback layer opposite to the first side is positioned toward an outermost surface of the touch-based user interface.

2. The touch-based user interface of claim 1, wherein at least one of the one or more actuators is a piezoelectric actuator.

3. The touch-based user interface of claim 1, wherein the printed circuit board layer further comprises a capacitive sensor.

4. The touch-based user interface of claim 3, wherein the capacitive sensor includes a first layer of electrodes and a second layer of electrodes, the first layer of electrodes overlaying the second layer of electrodes to form a grid defining one or more spaces between the first layer of electrodes and the second layer of electrodes.

5. The touch-based user interface of claim 4, wherein at least one of the one or more actuators is aligned along at least one vertical axis with at least one of the one or more spaces of the grid.

6. The touch-based user interface of claim 1, wherein the one or more force sensors are positioned underneath the printed circuit board layer.

7. The touch-based user interface of claim 1, wherein the one or more actuators forms at least a portion of an outer surface of the haptic feedback layer.

8. The touch-based user interface of claim 1, wherein the one or more actuators is joined to the nonconductive material by an adhesive.

9. The touch-based user interface of claim 1, wherein at least one of the one or more actuators is configured to move independently from another actuator of the one or more actuators.

10. The touch-based user interface of claim 1, wherein the one or more actuators form rows of actuators that extend laterally across the haptic feedback layer.

11. The touch-based user interface of claim 1, further comprising a cover layer overlaying the haptic feedback layer.

12. The touch-based user interface of claim 1, wherein the nonconductive material has a modulus of rigidity to prevent the nonconductive material from moving relative to the one or more actuators when a voltage is supplied to the one or more actuators.

13. A method for manufacturing a haptic feedback layer, comprising:
arranging one or more piezoelectric actuator strands so that each of the one or more piezoelectric actuator strands are spaced apart from one another;
melting a nonconductive material to form a liquid;
filling spaces between the piezoelectric actuator strands with the melted nonconductive material to form a blank so that the piezoelectric actuator strands are embedded within the nonconductive material;
cutting the blank to form a haptic feedback layer;
orienting one side of the haptic feedback layer toward a first side of a printed circuit board layer; and
coupling one or more force sensors to a second side of the printed circuit board layer that is opposite to the first side, wherein the one or more force sensors are configured to differentiate among a plurality of input commands based, at least in part, on an amount of force detected by the one or more force sensors.

14. The method of claim 13, wherein the blank is cut along a plane perpendicular to a direction of extension of the piezoelectric actuator strands.

15. The method of claim 13, wherein the blank is cut along a plane parallel to a direction of extension of the piezoelectric actuators strands.

16. The method of claim 15, wherein the blank is cut such that only the nonconductive material between the piezoelectric actuator strands is cut.

17. A touch-based input device, comprising:
one or more actuators embedded within a layer of nonconductive material and configured to supply a haptic feedback; and one or more force sensors embedded within a printed circuit board layer and configured to differentiate among a plurality of input commands based, at least in part, on an amount of force sensed by the one or more force sensors;

wherein the printed circuit board layer is attached to the layer of nonconductive material and comprises one or more conductive traces that supply a voltage to the one or more actuators, and the layer of nonconductive material is positioned toward an outermost surface of the touch-based user interface.

18. The touch-based input device of claim 17, wherein the outermost surface of the touch-based input device is configured to flex in response to a received force.

19. The touch-based input device of claim 17, wherein a first input command of the plurality of input commands is associated with a first gesture and a second input command of the plurality of input commands is associated with a second gesture.

20. The touch-based user interface of claim 4, wherein the capacitive sensor measures a change in capacitance at a location at which a first electrode of the first layer of electrodes crosses above a second electrode of the second layer of electrodes.

* * * * *